(12) United States Patent
Chang et al.

(10) Patent No.: US 7,312,531 B2
(45) Date of Patent: Dec. 25, 2007

(54) SEMICONDUCTOR DEVICE AND FABRICATION METHOD THEREOF

(75) Inventors: Hui-Lin Chang, HsinChu (TW);
Yung-Cheng Lu, Taipei (TW);
Chung-Chi Ko, Jushan Township, Nantou County (TW); Pi-Tsung Chen, Jiangjyun Township, Tainan County (TW); Shau-Lin Shue, Hsinchu (TW); Chien-Hsueh Shih, Taipei (TW); Hung-Wen Su, Jhubei (TW); Ming-Hsing Tsai, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 165 days.

(21) Appl. No.: 11/261,200

(22) Filed: Oct. 28, 2005

(65) Prior Publication Data

US 2007/0096326 A1    May 3, 2007

(51) Int. Cl.
*H01L 29/40* (2006.01)
*H01L 21/44* (2006.01)

(52) U.S. Cl. ........................ 257/770; 438/656
(58) Field of Classification Search ............... 438/643, 438/653, 675, 685, 642, 648, 652, 656; 257/751–754, 257/768–770, E29.297–E29.298, E23.141–E23.179
See application file for complete search history.

(56) References Cited

U.S. PATENT DOCUMENTS

| | | | |
|---|---|---|---|
| 6,100,184 A * | 8/2000 | Zhao et al. | 438/638 |
| 6,515,339 B2 | 2/2003 | Shin et al. | 257/368 |
| 6,949,461 B2 * | 9/2005 | Malhotra et al. | 438/643 |
| 7,060,619 B2 * | 6/2006 | Cowley et al. | 438/687 |
| 2003/0143398 A1 | 7/2003 | Ohki et al. | 428/398 |
| 2004/0005258 A1 * | 1/2004 | Fonash et al. | 422/271 |
| 2004/0142560 A1 | 7/2004 | Kuo et al. | 438/682 |
| 2004/0219773 A1 | 11/2004 | Choi et al. | 438/597 |

OTHER PUBLICATIONS

"Iron and Cobalt Silicide Catalysts-Assisted Carbon Nanostructures on the Patterned Si Substrates" Chang et al., 2002, pp. 219-224.
"Carbon Nanotube Vias for Futuer LSI Interconnects" Nihei et al., 2004.

* cited by examiner

*Primary Examiner*—Calvin Lee
(74) *Attorney, Agent, or Firm*—Thomas, Kayden, Horstemeyer & Risley

(57) ABSTRACT

Semiconductor devices and methods for fabricating the same. The devices include a substrate, a catalyst layer, a second dielectric layer, and carbon nanotubes (CNTs). The substrate comprises an overlying first dielectric layer with an electrode embedded therein. The catalyst layer overlies the electrode and the first dielectric layer and substantially comprises Co and $M_1$, wherein $M_1$ is selected from a group consisting of W, P, B, Bi, Ni, and a combination thereof. The second dielectric layer overlies the catalyst layer and comprises an opening exposing parts of the catalyst layer. The carbon nanotubes (CNTs) are disposed on the exposed catalyst layer and electrically connect the electrode.

32 Claims, 18 Drawing Sheets

SEMICONDUCTOR DEVICE AND FABRICATION METHOD THEREOF

BACKGROUND

The invention relates to semiconductor technology, and more specifically to carbon nanotubes (CNTs) applied in semiconductor interconnection.

As semiconductor device circuit density increases and device feature size decreases, increased numbers of patterned metal levels are required with decreased spacing between metal lines at each level to effectively interconnect discrete devices on semiconductor chips. Layers of insulating materials or films, typically referred to as inter-layer dielectric (ILD) layers, separate different levels of interconnections. Recently, copper lines and low-k dielectric have been utilized in the interconnections to reduce RC delay times and internal resistance. A low-k dielectric layer is formed on a substrate, followed by patterning to form damascene openings, and copper is filled in the damascene openings to form one of the wiring layers of the interconnections, copper being preferred for its resistance to chemical etching. The damascene openings are often incompletely filled when copper line width is reduced to 100 nm or less, increasing internal resistance of the interconnections or causing open circuitry, negatively affecting device reliability and process yield.

In other cases, low-k dielectric layers are often contaminated or damaged, resulting in increased dielectric constant. Thus, contaminated or damaged low-k dielectric layers are no longer "low-k" dielectric layers, negatively affecting the performance of the circuit, e.g., the frequency response or the like.

SUMMARY

Thus, embodiments of the invention provide semiconductor devices and methods for fabricating the same, preventing high resistance, open circuitry, and damage or contaminating of dielectric layers, thereby improving device reliability, yield, and performance.

Embodiments of the invention provide a wiring layer. The layer comprises a catalyst layer, a dielectric layer, and carbon nanotubes (CNTs). The catalyst layer overlies a substrate. The catalyst layer substantially comprises Co and $M_1$, wherein $M_1$ is selected from a group consisting of W, P, B, Bi, Ni, and a combination thereof, overlying a substrate. The dielectric layer overlies the catalyst layer and comprises an opening exposing at least parts of the catalyst layer. The CNTs are disposed on the exposed catalyst layer.

Embodiments of the invention further provide a method for forming a wiring layer. First, a catalyst layer is formed overlying a substrate. The catalyst layer substantially comprises Co and $M_1$, wherein $M_1$ is selected from a group consisting of W, P, B, Bi, Ni, and a combination thereof. A dielectric layer is then formed overlying the catalyst layer. The dielectric layer comprises an opening exposing parts of the catalyst layer. Finally, CNTs are formed on the exposed catalyst layer.

Embodiments of the invention further provide a semiconductor device. The device comprises a substrate, a catalyst layer, a second dielectric layer, and CNTs. The substrate comprises an overlying first dielectric layer with an electrode embedded therein. The catalyst layer overlies the electrode and the first dielectric layer. The catalyst layer substantially comprises Co and $M_1$, wherein $M_1$ is selected from a group consisting of W, P, B, Bi, Ni, and a combination thereof. The second dielectric layer overlies the catalyst layer and comprises an opening exposing parts of the catalyst layer. The CNTs are disposed on the exposed catalyst layer, electrically connecting the electrode.

Embodiments of the invention further provide a method for fabricating a semiconductor device. First, a substrate, comprising an overlying first dielectric layer with an electrode embedded therein, is provided. A catalyst layer is then formed overlying the electrode and the first dielectric layer. The catalyst layer substantially comprises Co and $M_1$, wherein $M_1$ is selected from a group consisting of W, P, B, Bi, Ni, and a combination thereof. Further, a second dielectric layer is formed overlying the catalyst layer. The second dielectric layer comprises an opening exposing parts of the catalyst layer. Finally, CNTs are formed on the exposed catalyst layer.

Embodiments of the invention further provide a semiconductor device comprising a substrate, a catalyst layer, a second dielectric layer, CNTs, and an interconnection layer. The substrate comprises an overlying first dielectric layer with a first electrode embedded therein. The catalyst layer overlies the electrode and the first dielectric layer. The catalyst layer substantially comprises Co and $M_1$, wherein $M_1$ is selected from a group consisting of W, P, B, Bi, Ni, and a combination thereof. The second dielectric layer overlies the catalyst layer and comprises an opening exposing parts of the catalyst layer. The CNTs are disposed on the exposed catalyst layer utilizing a second electrode, electrically connecting the electrode. The interconnection layer overlies the second dielectric layer and the CNTs. The interconnection layer comprising a third dielectric layer with a third electrode embedded therein, electrically connects the CNTs.

Embodiments of the invention further provide semiconductor device comprising a substrate, a selective catalyst layer, CNTs, and a second dielectric layer. The substrate comprises an overlying first dielectric layer with an electrode embedded therein. The selective catalyst layer overlies the electrode. The selective catalyst layer substantially comprises Co and $M_1$, wherein $M_1$ is selected from a group consisting of W, P, B, Bi, Ni, and a combination thereof. The CNTs are disposed on the catalyst layer, electrically connecting the electrode. The second dielectric layer overlies the substrate beyond the CNTs.

Embodiments of the invention further provide a method for fabricating a semiconductor device. First, a substrate, comprising an overlying first dielectric layer with an electrode embedded therein, is provided. A catalyst layer is then formed overlying the electrode by electroless plating. The catalyst layer substantially comprises Co and $M_1$, wherein $M_1$ is selected from a group consisting of W, P, B, Bi, Ni, and a combination thereof. Further, CNTs are formed on the catalyst layer. Finally, a second dielectric layer is formed overlying the substrate and beyond the CNTs.

Embodiments of the invention further provide a semiconductor device comprising a substrate, a selective catalyst layer, a second dielectric layer, and CNTs. The substrate comprises an overlying first dielectric layer with a first electrode embedded therein. The selective catalyst layer overlies the electrode. The selective catalyst layer substantially comprises Co and $M_1$, wherein $M_1$ is selected from a group consisting of W, P, B, Bi, Ni, and a combination thereof. The second dielectric layer overlies the catalyst layer and comprises an opening exposing the catalyst layer. The CNTs are disposed on the exposed catalyst layer acting as a second electrode, electrically connecting the electrode. The interconnection layer overlies the second dielectric layer and the CNTs. The interconnection layer comprises a third dielectric layer with a third electrode embedded therein, electrically connecting the CNTs.

Embodiments of the invention further provide a semiconductor device comprising a substrate, a first CNT catalyst layer, a first dielectric layer, plug CNTs, a second CNT catalyst layer, a second dielectric layer, and wiring CNTs. The substrate comprises an electrode. The first CNT catalyst layer overlies the electrode. The first dielectric layer overlies the substrate and comprises a first opening exposing the first CNT catalyst layer. The plug CNTs are disposed on the exposed first CNT catalyst layer, electrically connecting the electrode. The second CNT catalyst layer overlies the plug CNTs. The second dielectric layer overlies the substrate and comprises a second opening exposing the second CNT catalyst layer. The wiring CNTs are disposed on the exposed second CNT catalyst layer, electrically connecting the plug CNTs.

Embodiments of the invention further provide a fabrication method of a semiconductor device. First, a substrate comprising an electrode is provided. A CNT catalyst layer is then formed overlying the substrate. Further, CNTs are formed on the CNT catalyst layer. The CNTs electrically connect the electrode. Finally, the CNTs are patterned to form plug CNTs overlying and electrically connecting the electrode.

Embodiments of the invention further provide a fabrication method of a semiconductor device. First, a substrate comprising an electrode is provided. A first CNT catalyst layer is then selectively formed on the electrode. Next, first CNTs are formed on the first CNT catalyst layer. Next, a first dielectric layer is formed overlying the substrate and beyond the plug CNTs. Next, a second CNT catalyst layer is formed overlying the plug CNTs and first dielectric layer. The second CNT catalyst layer comprises a wiring pattern. Further, second CNTs are formed on the second CNT catalyst layer. Finally, a second dielectric layer is formed overlying the substrate and beyond the plug CNTs.

Embodiments of the invention further provide a fabrication method of a semiconductor device. First, a substrate comprising an electrode is provided. The substrate is then pre-cleaned. Further, a cap layer is formed-overlying the electrode by electroless plating. The cap layer substantially comprises Co and $M_1$, wherein $M_1$ is selected from a group consisting of W, P, B, Bi, Ni, and a combination thereof. Finally, the substrate is post-cleaned.

Embodiments of the invention further provide a semiconductor device. The device comprises a substrate, a catalyst layer, CNTs, and an electrode. The catalyst layer overlies the electrode and the first dielectric layer. The catalyst layer substantially comprises Co and $M_1$, wherein $M_1$ is selected from a group consisting of W, P, B, Bi, Ni, and a combination thereof. The CNTs are disposed on the catalyst layer, electrically connecting the electrode.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention can be more fully understood by reading the subsequent detailed description in conjunction with the examples and references made to the accompanying drawings, which are given by way of illustration only, and thus are not limitative of the invention, and wherein.

DESCRIPTION

The following embodiments are intended to illustrate the invention more fully without limiting the scope of the claims, since numerous modifications and variations will be apparent to those skilled in this art.

FIGS. 1A through 1D show wiring layers 110a through 110d of a first embodiment of the invention.

Figure 1A:
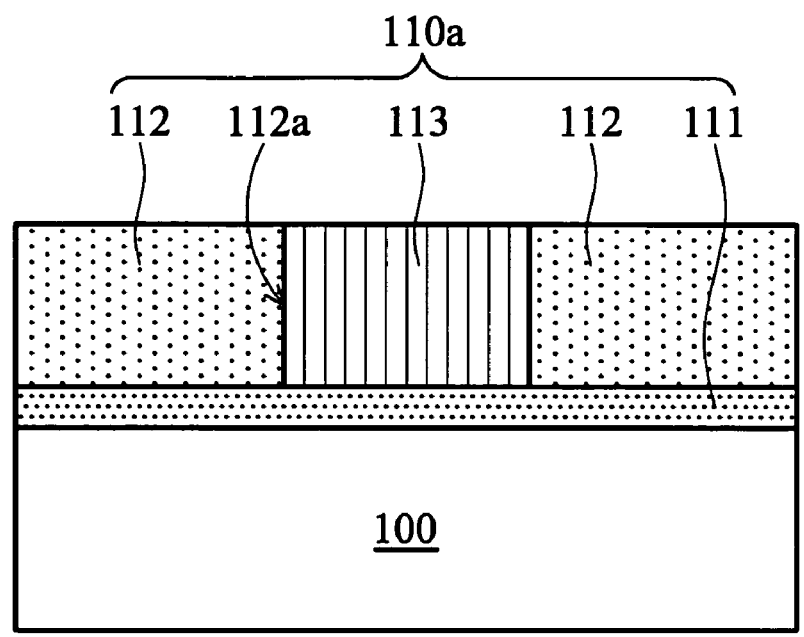
FIGS. 1A through 1D are cross-sections of wiring layers of a first embodiment of the invention.
Figure 1B:
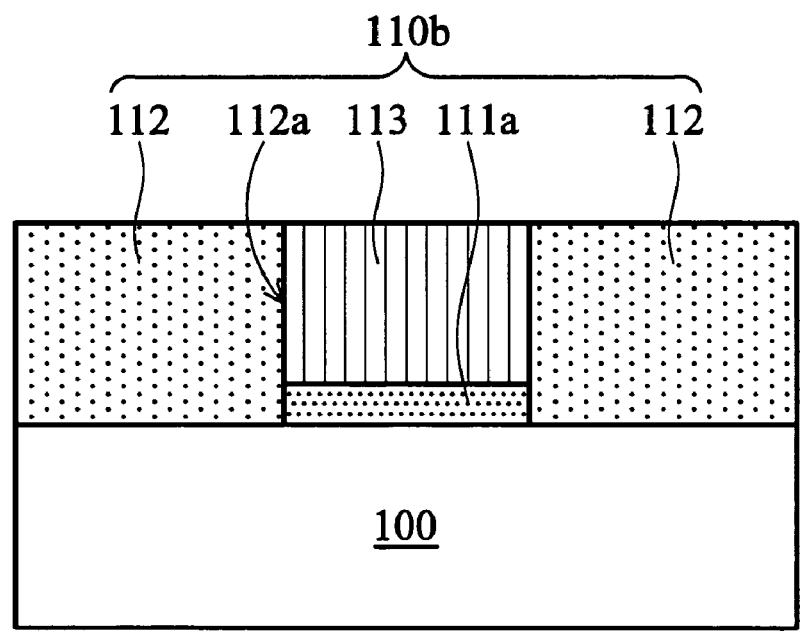

In FIG. 1A, wiring layer 110a comprises a catalyst layer 111, a dielectric layer 112, and carbon nanotubes (CNTs) 113. The catalyst layer 111 overlies a substrate 100. The catalyst layer 111 substantially comprises Co and $M_1$, wherein $M_1$ is selected from a group consisting of W, P, B, Bi, Ni, and a combination thereof, overlying a substrate for deposition of CNTs. More preferably, the catalyst layer 111 substantially comprises CoWP, CoWBP, CoWBiP, CoBiP, CoBP, CoBi, CoB, or a combination thereof. In some cases, the catalyst layer 111 substantially comprises CoWP. The dielectric layer 112 overlies the catalyst layer 111 and comprises an opening 112a exposing at least parts of the catalyst layer 111. The dielectric layer 112 is preferably low-k dielectric. The CNTs 113 are disposed on the exposed catalyst layer 111. The catalyst layer 111, as the name indicates, acts as a catalyst for deposition of the CNTs 113.

In some cases, the catalyst layer may be patterned or selectively formed overlying the substrate, such as the catalyst layer 111a. Thus, the CNTs 113 can be formed in a predetermined pattern prior to forming the dielectric layer 112 due to the CNTs 113 only being formed on the catalyst. When the dielectric layer 112 is formed, the catalyst layer 111a is in the opening 112a and the dielectric layer 112 is directly on the substrate 100.

In some cases, subsequent processes such as planarization of the dielectric layer 112, thermal process, or other processes may damage or oxidize the CNTs 113. Thus, a cap layer 114 as shown in FIG. 1C or an atomic cap layer 115 as shown in FIG. 1D, for example, is optionally provided overlying the CNTs 113.

Figure 1C:
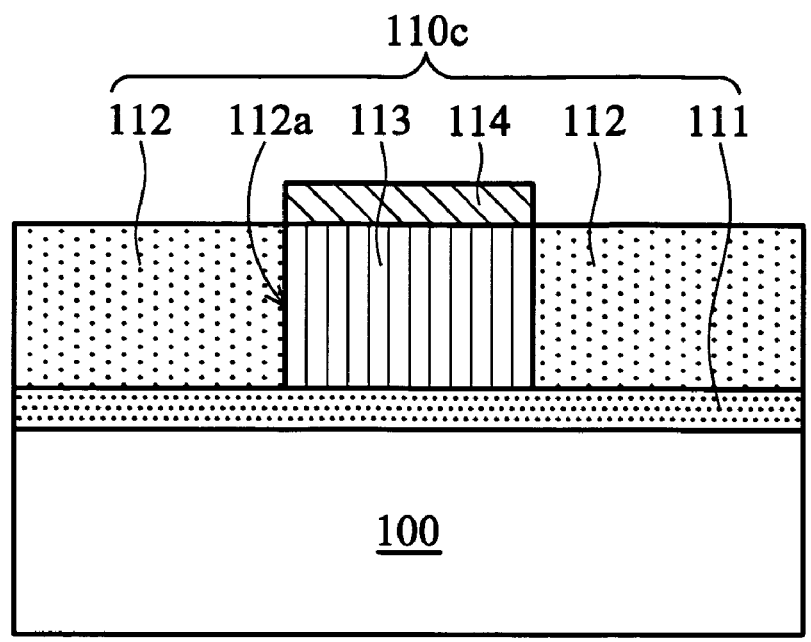

In FIG. 1C, the cap layer 114 may be selectively formed overlying the CNTs 113 by a method such as electroless plating or other methods. Alternatively, the cap layer 114 may be blanketly formed overlying the substrate 100 by a method such as CVD, PVD, or other methods, followed by patterning. In this embodiment, the CNTs 113 fill the opening 112a and the cap layer 114 protrudes from the dielectric layer 112. Alternatively, the CNTs 113 may incompletely fill the opening 112a and the cap layer 114 may be disposed in the openings 112a, filling the openings 112a.

The cap layer 114 preferably comprises Fe, Co, Ni, FeWP, FeWBP, FeWBiP, FeBiP, FeBP, FeBi, FeB, CoWP, CoWBP, CoWBiP, CoBiP, CoBP, CoBi, CoB, NiWP, NiWBP, NiWBiP, NiBiP, NiBP, NiBi, NiB, FeSi, CoSi, NiSi, or a combination thereof. In some cases, other CNTs can be formed on the cap layer 114. The cap layer 114 is preferably between 25 and 400 Å thick, and more preferably, approximately 50 Å.

Figure 1D:
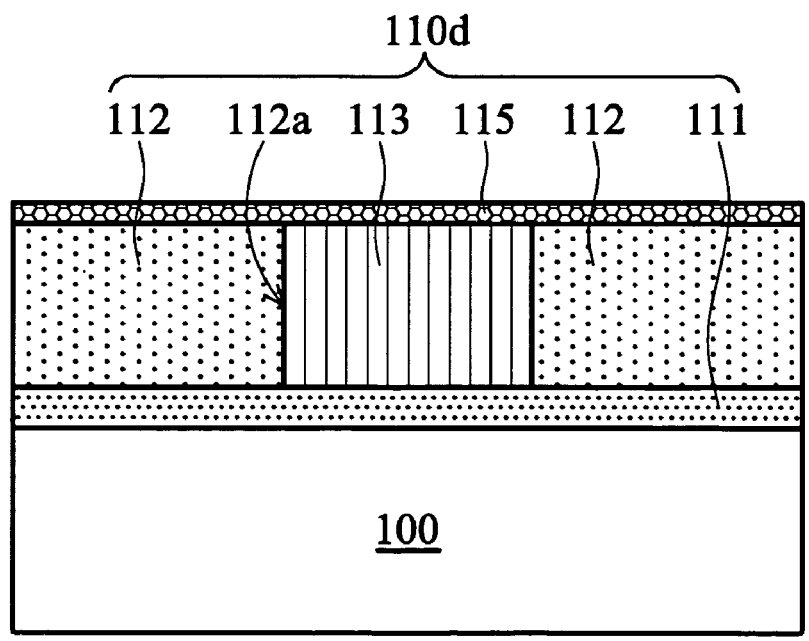

In FIG. 1D, the cap layer 115 is formed by a method such as atomic layer chemical vapor deposition (ALCVD) or other methods overlying the CNTs 113 and dielectric layer 112. The cap layer 115 preferably comprises Ta/TaN or Ti/TiN. The cap layer 115 is preferably between 2 and 10 Å thick, and more preferably, approximately 5 Å thick.

Figure 2A:
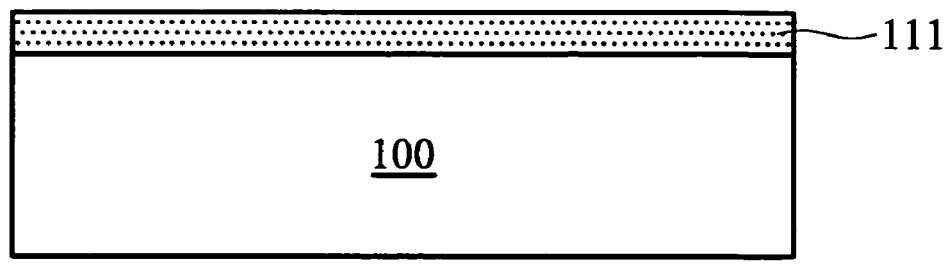
FIGS. 2A and 2B are cross-sections of methods for forming wiring layers of the invention.
Figure 2B:
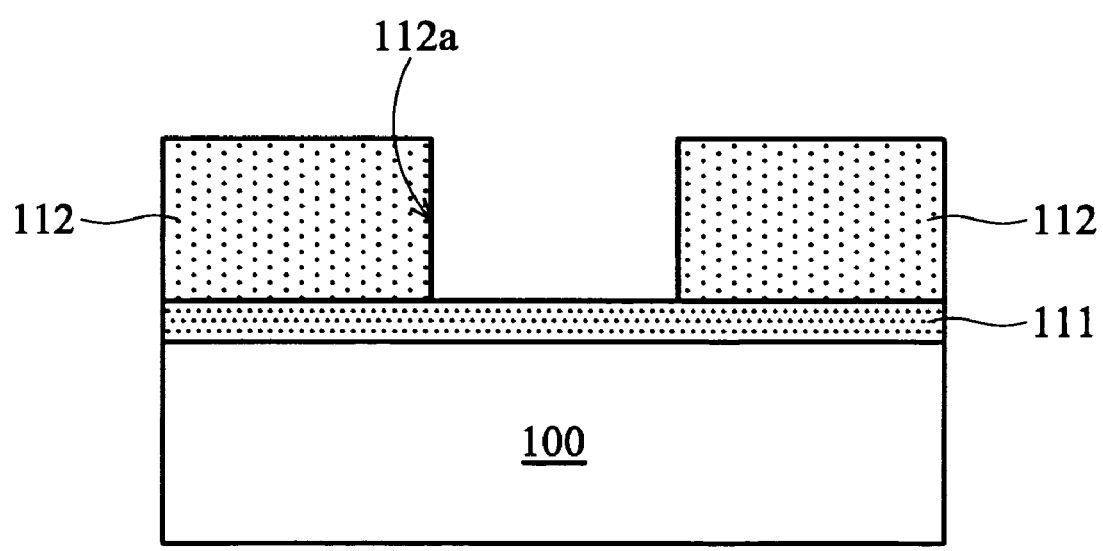

FIGS. 2A and 2B show methods for forming wiring layers of the invention.

In FIG. 2A, the catalyst layer 111 is formed overlying the substrate 100 by a method such as PVD or other. Preferably, the catalyst layer 111 is formed by sputtering. The catalyst layer 111 substantially comprises Co and $M_1$, wherein $M_1$ is selected from a group consisting of W, P, B, Bi, Ni, and a combination thereof.

In FIG. 2B, the dielectric layer 112 is formed overlying the catalyst layer 111 by a method such as CVD, spin-coating, or other methods, followed by patterning to form the opening 112a exposing parts of the catalyst layer 111.

As described, the catalyst layer 111 may be patterned and then have CNTs formed thereon prior to forming the dielectric layer 112. Details regarding selective formation of catalyst layers are described in subsequent embodiments.

Finally, the CNTs 113 are formed on the exposed catalyst layer 111 by a method such as CVD or other to complete the wiring layer 110a shown in FIG. 1A. The precursors for the CVD comprise carbon atoms, and may further comprise hydrogen atoms. The precursors preferably comprise ethane, acetylene, combinations thereof, or other carbon-containing gases. Further, the precursors may further comprise hydrogen gas. Power for the CVD is preferably between 300 and 1500 W. The deposition temperature of the CNTs 113 is preferably between 300 and 450° C. The deposition pressure for the CNTs 113 is preferably 0.1 and 10 Torr.

As described, the cap layer 114 or 115 is optionally formed to protect the CNTs 113 from damage or oxidization.

FIGS. 3A through 3E show semiconductor devices of a second embodiment of the invention.

Figure 3A:
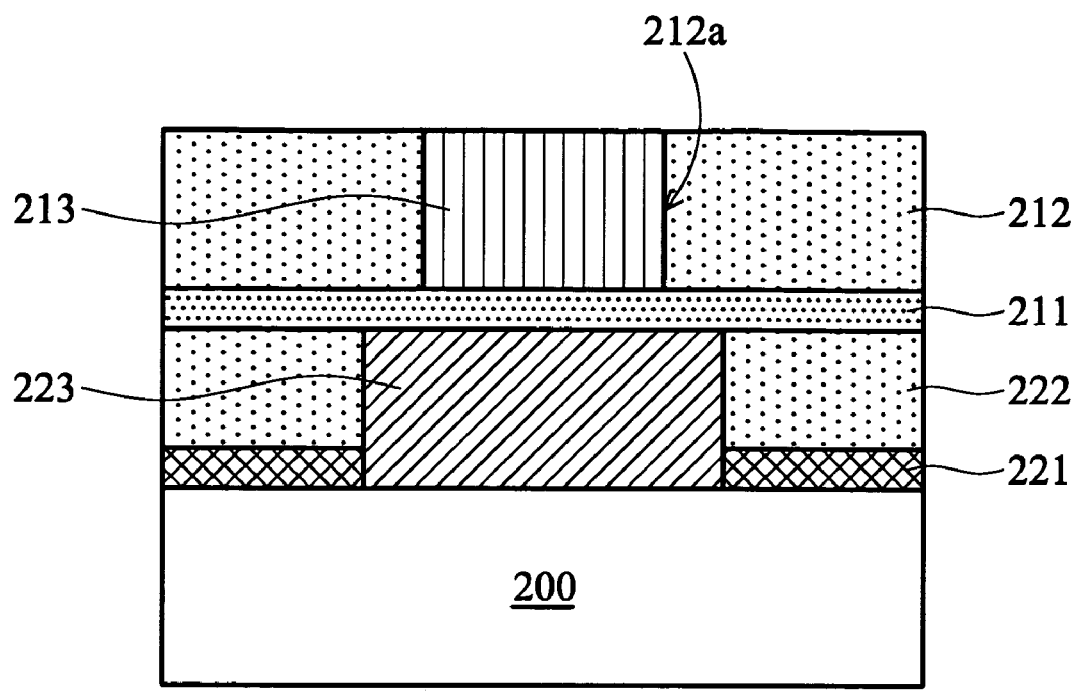
FIGS. 3A through 3E are cross-sections of semiconductor devices of a second embodiment of the invention.

In FIG. 3A, a semiconductor device comprises a substrate 200, a catalyst layer 211, a second dielectric layer 212, and CNTs 213. The substrate 200 comprises an overlying first dielectric layer 222 with an electrode 223 embedded therein, and may optionally comprise an etch stop layer 221 underlying the first dielectric layer 222. The catalyst layer 211 overlies the electrode 223 and the first dielectric layer 222. The second dielectric layer 212 overlies the catalyst layer 211 and comprises an opening 212a exposing parts of the catalyst layer 211. The CNTs 213 are disposed on the exposed catalyst layer 211, electrically connecting the electrode 223.

The substrate 100 comprises semiconductor materials such as silicon, germanium, silicon germanium, compound semiconductor, or other known semiconductor materials. The substrate 100 typically comprises processed active devices, such as diodes, transistors, or other known active devices, (not shown) therein. The electrode 223 typically electrically connects one or more of the active devices.

The electrode 223 preferably comprises metal, doped silicon, metal silicide, conductive metal nitride, transparent electrode, or other known conductive materials. In IC industries, for example, the electrode 223 preferably comprises copper to reduce internal resistance of the interconnections. In some cases, the electrode 223 may be a terminal of a wiring layer or a plug connecting two wiring layers.

In this embodiment, the CNTs 213 are utilized as a second electrode and can be a terminal of a wiring layer or a plug connecting two wiring layers.

The first dielectric layer 222 is preferably low-k dielectric and can be formed by a method such as CVD, spin-coating, or other method.

Figure 3B:
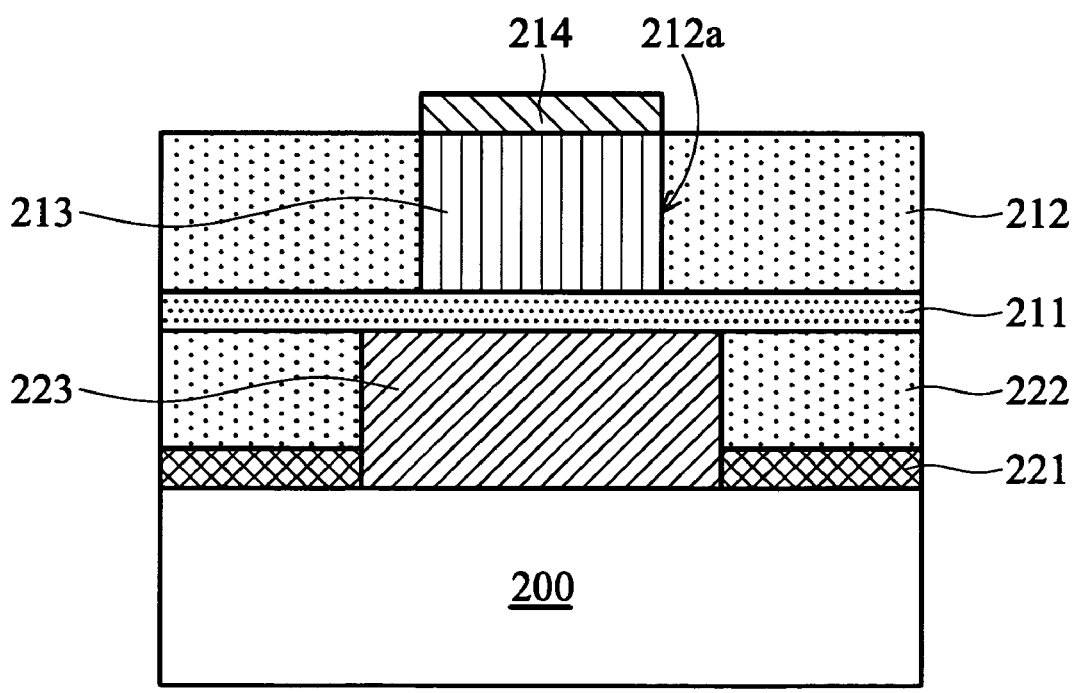

In FIG. 3B, a cap layer 214 is optionally formed overlying the CNTs 213. Alternatively, in FIG. 3C, an atomic cap layer 215 is optionally formed overlying the CNTs 213 and the second dielectric layer 212.

Details regarding the catalyst layer 211, the second dielectric layer 212, the CNTs 213, the cap layer 214, and the atomic cap layer 215 are the same as the catalyst layer 111, the second dielectric layer 112, the CNTs 113, the cap layer 114, and the atomic cap layer 115 shown in FIGS. 1A through 1D, and thus, are omitted herefrom.

Figure 3C:
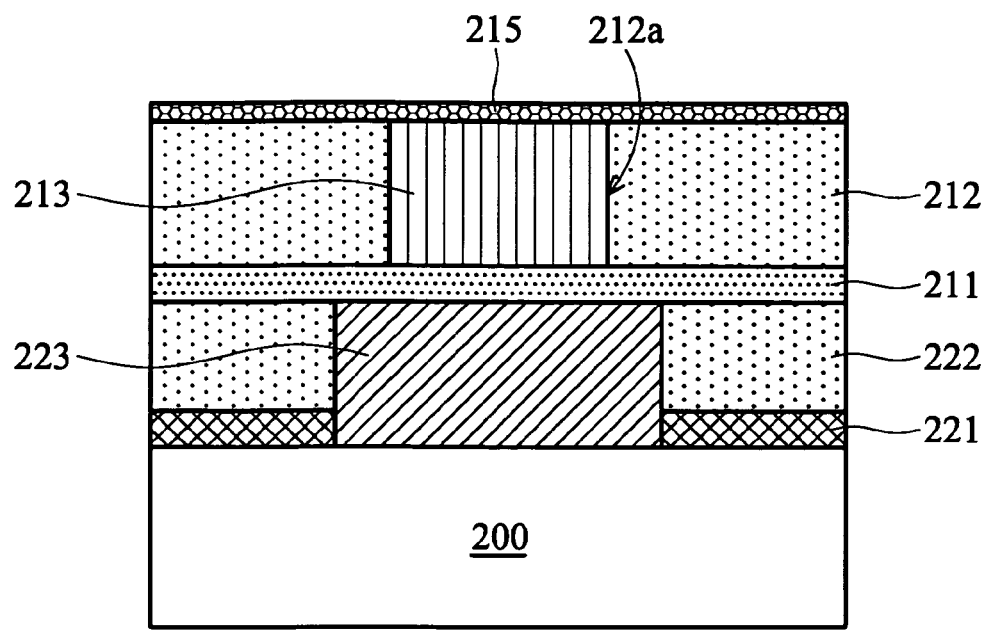
Figure 3D:
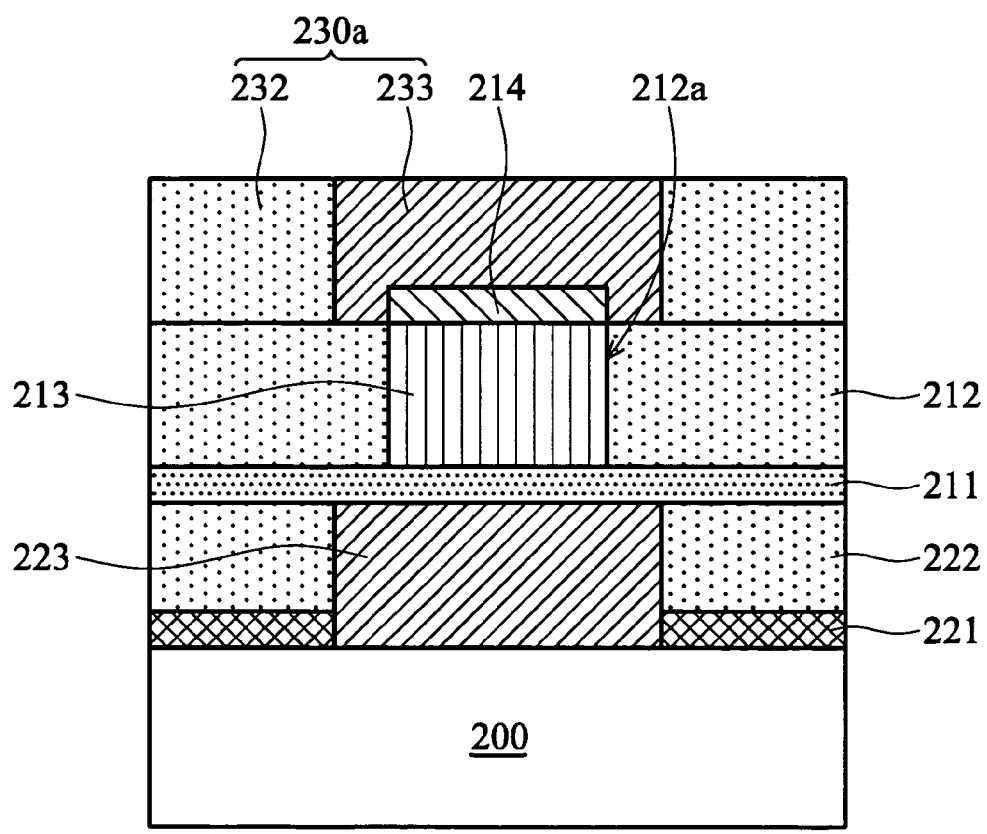

In FIG. 3D, an interconnection layer 230a is formed overlying the semiconductor device shown in FIG. 3B by a method such as known damascene process. The interconnection layer 230a comprises a third dielectric layer 232 with a third electrode 233 embedded therein electrically connecting the CNTs 213. Thus, the CNTs 213 is utilized as a plug connecting terminals 223 and 233 of two wiring layers. The dielectric layer 232 preferably comprises low-k dielectric. Formation of such an interconnection layer overlying the devices shown in FIG. 3A requires an etching stop layer to protect the CNTs 213, but the etching stop layer increases the dielectric constant of the dielectric layer in the interconnection layer. It is appreciated that the cap layer 214 protects the CNTs 213, and thus, the wiring layer 230 no longer requires the etch stop layer, improving the electrical performance of the semiconductor device.

Figure 3E:
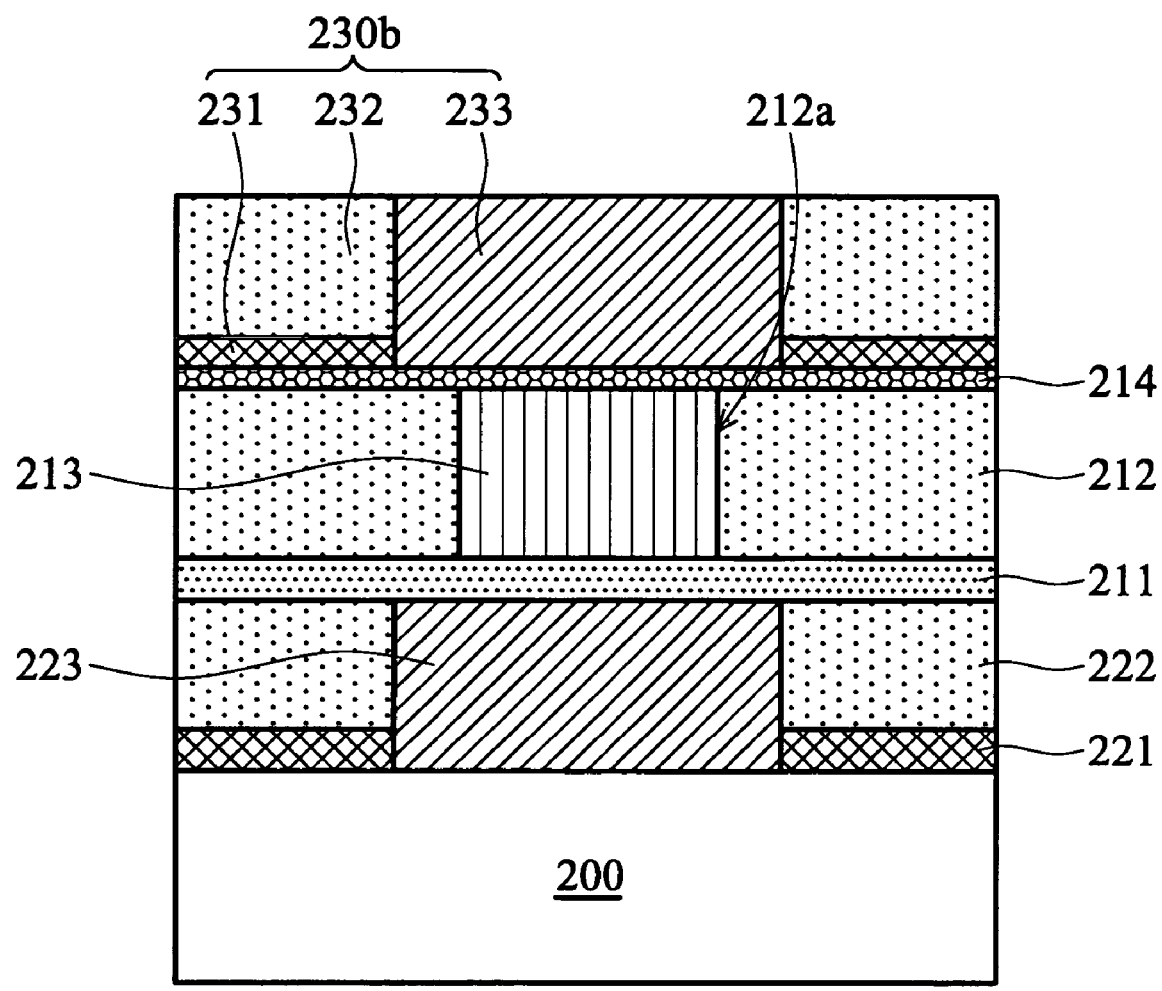

In FIG. 3E, an interconnection layer 230b is formed overlying the semiconductor device shown in FIG. 3C by a method such as known damascene process. The interconnection layer 230b comprises a third dielectric layer 232 with a third electrode 233 embedded therein electrically connecting the CNTs 213. In some cases, the interconnection layer 230b may further comprise an etch stop layer underlying the third dielectric layer 232.

Further, the interconnection layer 230b may be formed overlying the semiconductor device shown in FIG. 3A by a method such as known damascene process. Details regarding thereto are the same as described, and thus, are omitted herefrom.

Figure 4A:
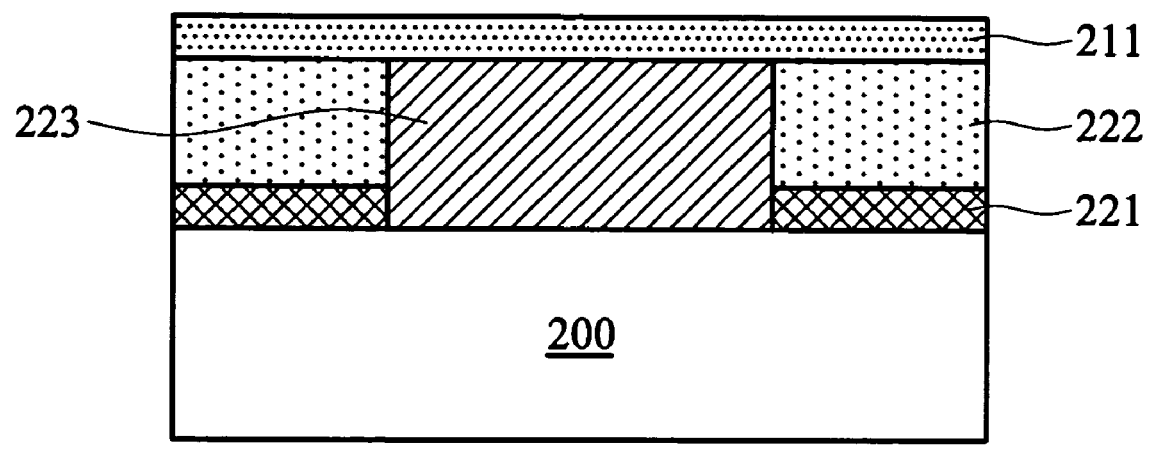
FIGS. 4A through 4C are cross-sections of fabrication methods of semiconductor devices of the invention.
Figure 4B:
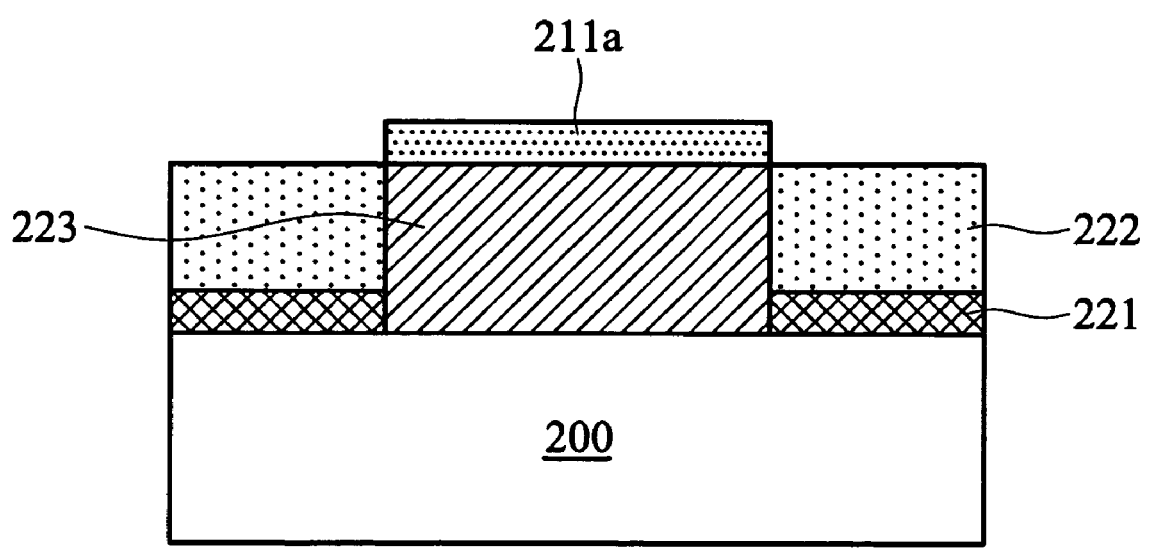
Figure 4C:
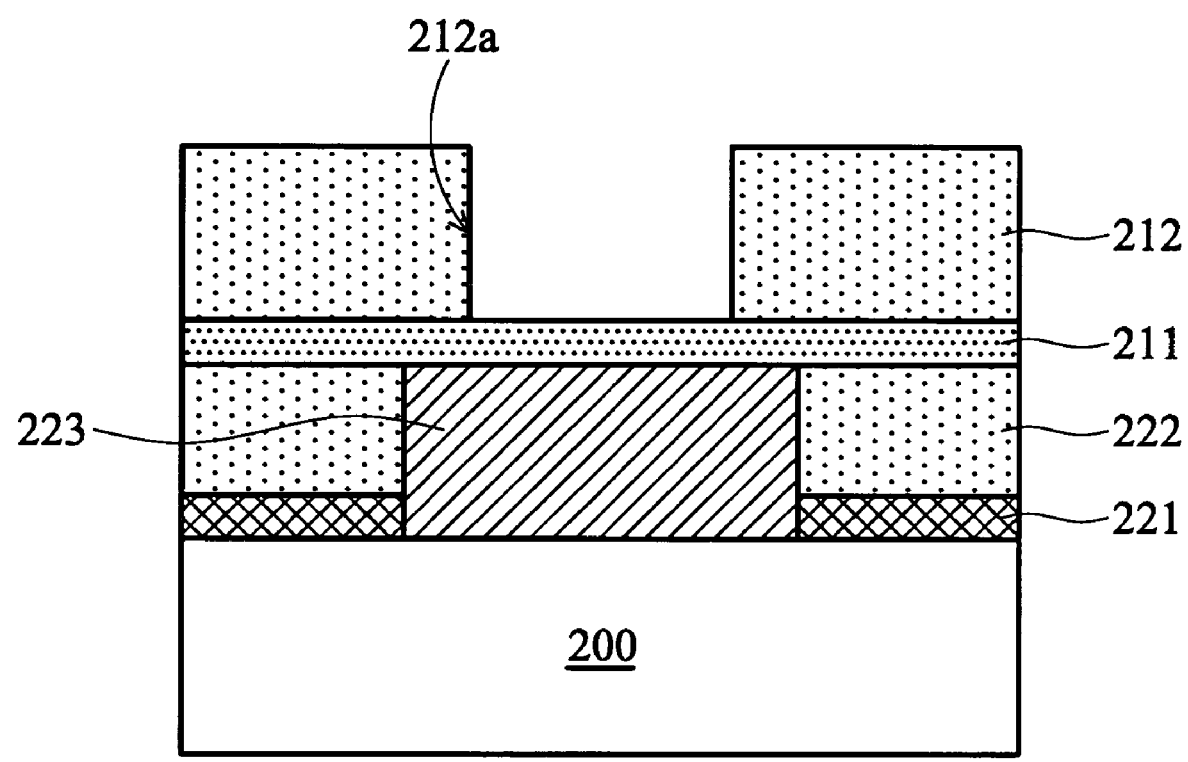

FIGS. 4A through 4C show methods for forming semiconductor devices of the invention.

In FIG. 4A, a substrate 200, comprising an overlying first dielectric layer 222 with an electrode 223 embedded therein, is provided. The substrate 200 further comprises an etch stop layer 221 underlying the dielectric layer 222. The catalyst layer 211 is then formed overlying the electrode 223 and the dielectric layer 222 by a method such as PVD or other. Preferably, the catalyst layer 211 is formed by sputtering. The catalyst layer 211 substantially comprises Co and $M_1$, wherein $M_1$ is selected from a group consisting of W, P, B, Bi, Ni, and a combination thereof for subsequent CNT deposition. Specifically, the catalyst layer 211, as the name indicates, is utilized as a catalyst for forming carbon nanotubes.

In FIG. 4B, the catalyst layer 211 may be optionally patterned to form a patterned catalyst layer 211a overlying the electrode 223. As described, CNTs can be formed prior to forming a dielectric layer.

In FIG. 4C following FIG. 4A, a second dielectric layer 222 is formed overlying the catalyst layer 211 by a method such as CVD, spin-coating, or other methods, followed by patterning to form an opening 212a exposing parts of the catalyst layer 211.

Finally, CNTs 213 are formed on the exposed catalyst layer 211 by a method such as CVD or other to complete the semiconductor device shown in FIG. 3A. When the width of the opening 212a is reduced to 100 nm or less, the CNTs 213 retain effective filling performance due to the linear nanostructure thereof, improving device performance, yield, and reliability. Details regarding formation of the CNTs 213, cap layer 214, and atomic cap layer 215 are the same as formation of the CNTs 113, cap layer 114, and atomic cap layer 115, and thus, are omitted herefrom.

Figure 5A:
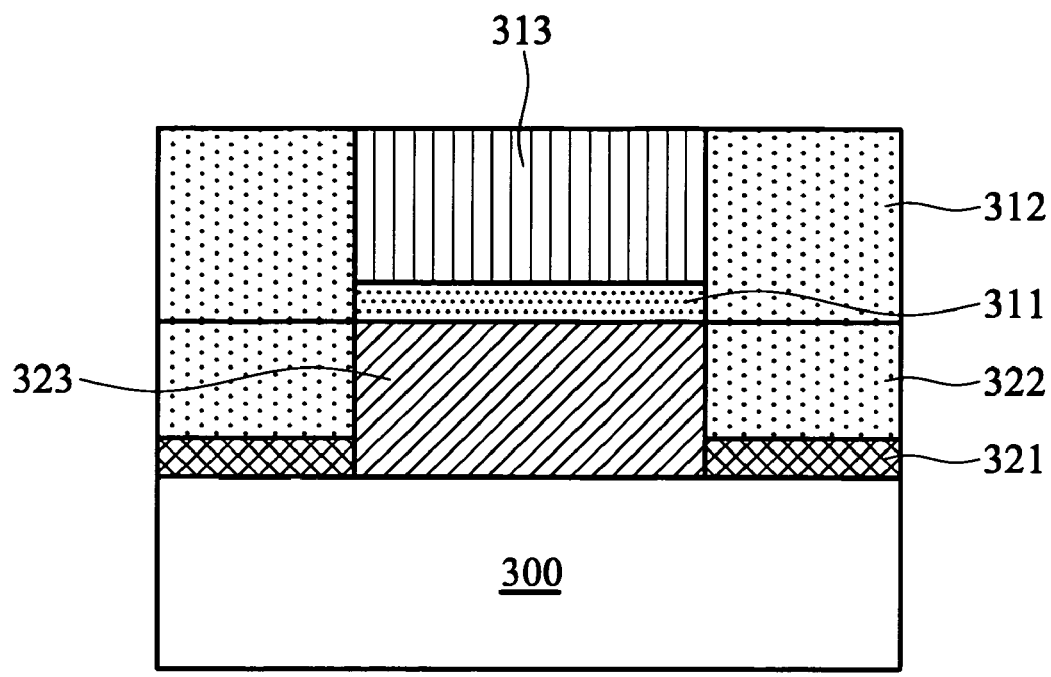
FIGS. 5A through 5C are cross-sections of semiconductor devices of a third embodiment of the invention.
Figure 5B:
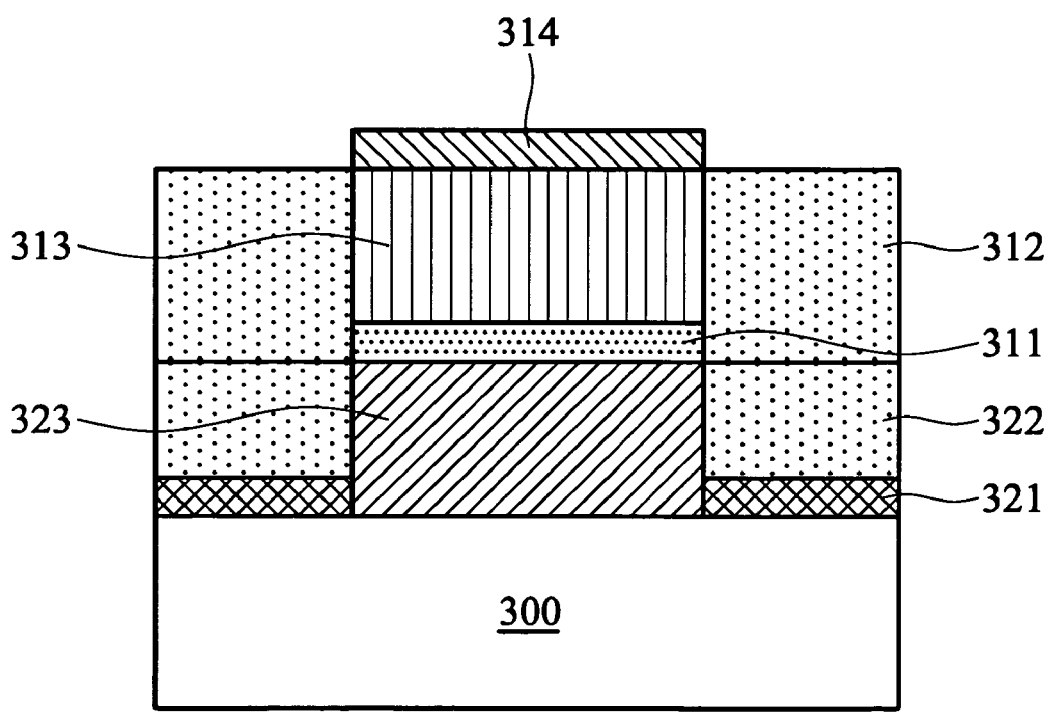
Figure 5C:
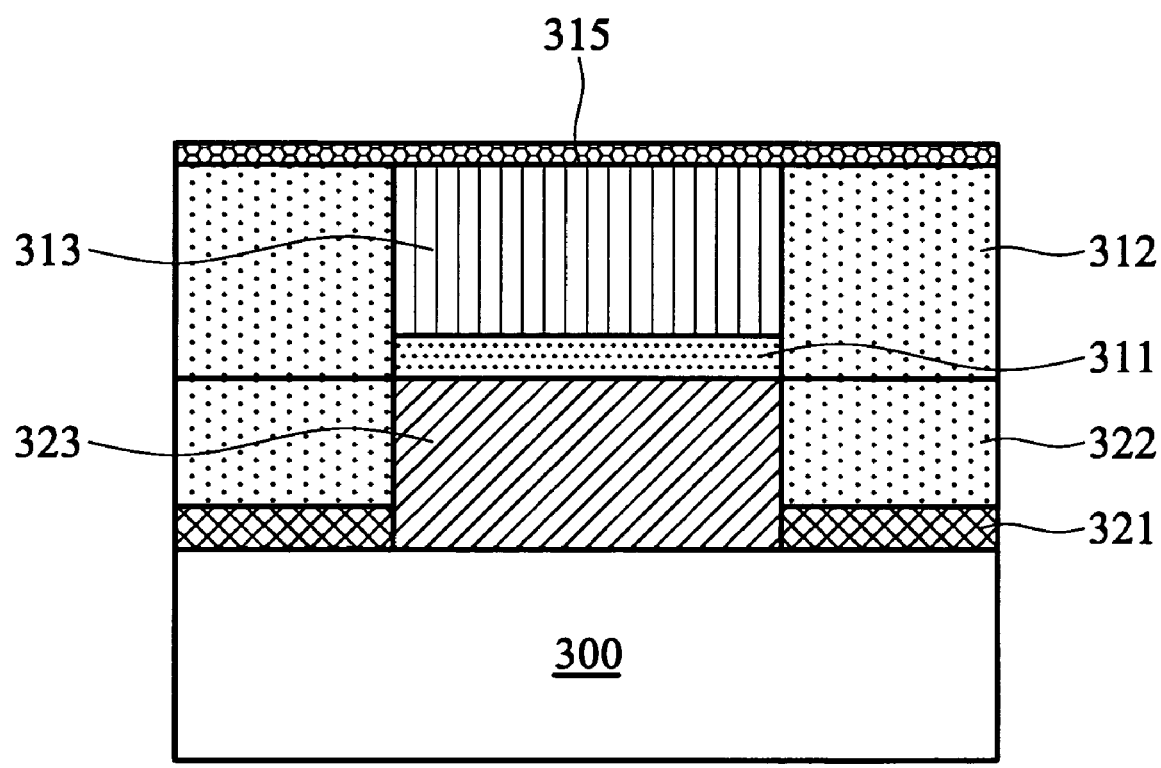

FIGS. 5A through 5C show semiconductor devices of a third embodiment of the invention.

In FIG. 5A, the semiconductor device comprises a substrate 300, a selective catalyst layer 311, CNTs 313, and a second dielectric layer 312. The substrate 300 comprises an overlying first dielectric layer 322 with an electrode 323 embedded therein. The substrate 300 may optionally comprise an etch stop layer 321 underlying the first dielectric layer 322. Details regarding the etch stop layer 321, the first dielectric layer 322, and the electrode 323 are the same as the etch stop layer 221, the first dielectric layer 222, and the electrode 223 shown in FIG. 3A, and thus, are omitted herefrom.

The selective catalyst layer 311 overlies the electrode 323. The selective catalyst layer 311 substantially comprises Co and $M_1$, wherein $M_1$ is selected from a group consisting of W, P, B, Bi, Ni, and a combination thereof. The selective catalyst layer 311 preferably comprises CoWP, CoWBP, CoWBiP, CoBiP, CoBP, CoBi, CoB, or a combination thereof. The CNTs 313 are disposed on the catalyst layer 311, electrically connecting the electrode 323. The second dielectric layer 312 overlies the substrate 300 beyond the CNTs 313. Other details regarding the selective catalyst layer 311, the second dielectric layer 312, and the CNTs 313 are the same as the catalyst layer 211, the second dielectric layer 212, and the CNTs 213 shown in FIG. 3A, and thus, are omitted herefrom.

In FIG. 5B, a cap layer 314 is optionally formed overlying the CNTs 313. Alternatively, in FIG. 5C, an atomic cap layer 315 is optionally formed overlying the CNTs 313 and the second dielectric layer 312. Details regarding the cap layer 314 and the atomic cap layer 315 are the same as the cap layer 114 and the atomic cap layer 115 shown in FIGS. 1C and 1D, and thus, are omitted herefrom.

Further, the interconnection layer 230a shown in FIG. 3D may be formed overlying the semiconductor device shown in FIG. 5B by a method such as known damascene process. The interconnection layer 230b shown in FIG. 3E may be formed overlying the semiconductor devices shown in FIGS. 5A and 5C by a method such as known damascene process. Details regarding thereto are the same as described, and thus, are omitted herefrom.

Figure 6A:
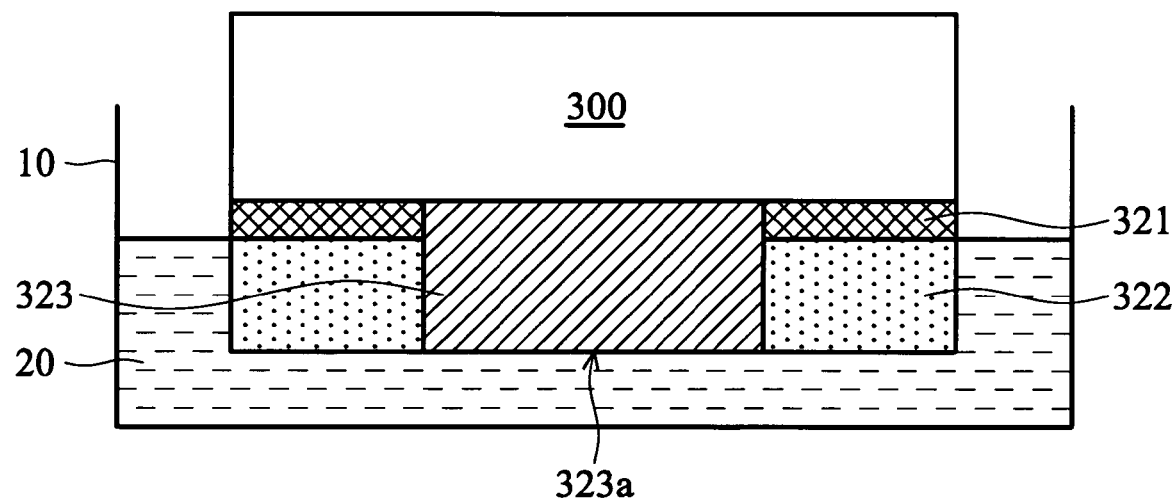
FIGS. 6A through 6C are cross-sections of fabrication methods of semiconductor devices o of the invention.
Figure 6B:
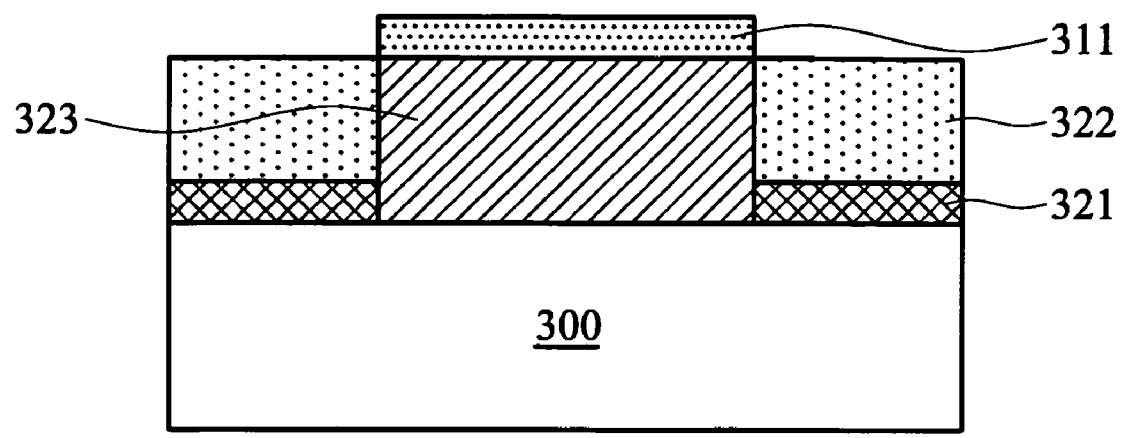
Figure 6C:
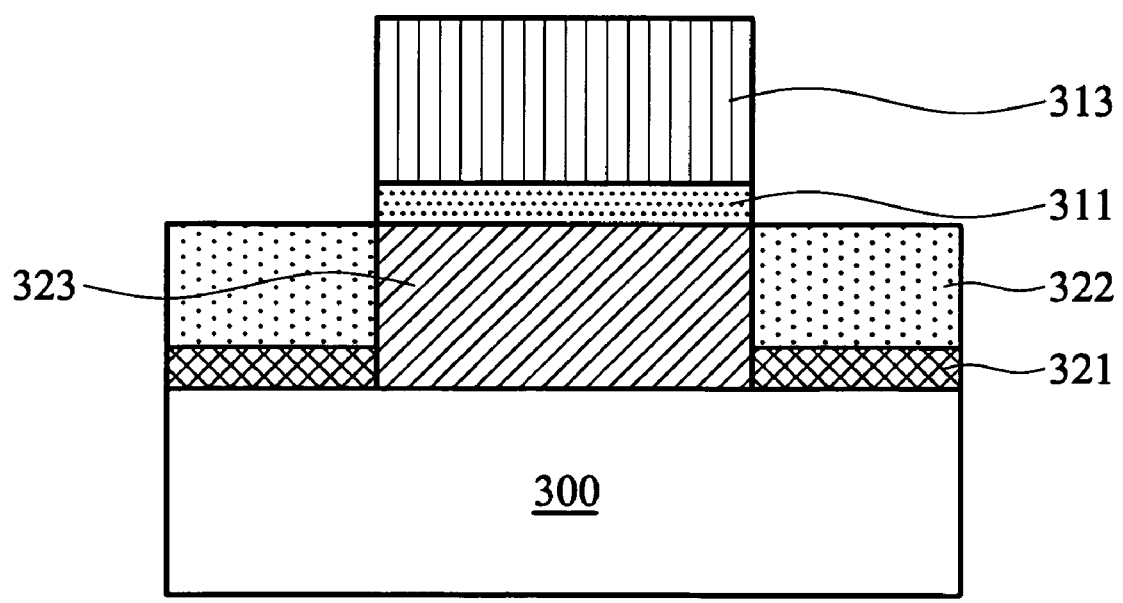

FIGS. 6A through 6C show methods for forming semiconductor devices of the invention.

In FIG. 6A, a substrate 300, comprising an overlying first dielectric layer 322 with an electrode 323 embedded therein, is provided. The substrate 300 further comprises an etch stop layer 321 underlying the dielectric layer 322. The selective catalyst layer 311 is then formed overlying the electrode 323 by electroless plating as shown in FIG. 6B. Surfaces of the first dielectric layer 322 and the electrode 323 are preferably pre-cleaned prior to formation of the selective catalyst layer 311 to remove potential contaminants and oxides therefrom.

The catalyst layer 311 substantially comprises Co and $M_1$, wherein $M_1$ is selected from a group consisting of W, P, B, Bi, Ni, and a combination thereof for subsequent CNT deposition. Specifically, the catalyst layer 311, as the name indicates, is utilized as a catalyst for forming carbon nanotubes.

When forming CoBi, CoBiP, CoWBiP, or combination thereof utilized as the selective catalyst layer 311, for example, the selective catalyst layer 311 can be formed immediately after pre-cleaning. Alternatively, when the electrode 323 comprises metal such as copper or other metals, the surface thereof can be activated by, for example, Pd. The electrode 323 can be immersed in a Pd-containing solution, such as Pd ion-containing solution 20 in a tank 10 as shown in FIG. 6A, to form a Pd-activated surface 323a, followed by electroless plating of the selective catalyst layer 311. During electroless plating, the selective catalyst layer 311 is formed on the electrode 323 only. After electroless plating of the selective catalyst layer 311, the exposed surfaces of the substrate 300 are preferably post-cleaned.

In FIG. 6C, it is appreciated that the selective catalyst layer 311 is formed on the electrode 323 only and the CNTs can be formed on the catalyst only as described, the CNTs 313 can be formed prior to formation of the dielectric layer. Details regarding formation of the CNTs 313 are the same as formation of the CNTs 113 and thus, are omitted herefrom.

Finally, the second dielectric layer 312 as shown in FIG. 5A is formed overlying the substrate 300 and beyond the CNTs 313. It is appreciated that the second dielectric layer 312 is formed after formation of the CNTs 313. The second dielectric layer 312 does not undergo the patterning process, and thus, the second dielectric layer 312 is not damaged or contaminated, remaining the original dielectric constant, improving device performance.

Further, either the cap layer 314 as shown in FIG. 5B or the atomic layer 315 as shown in FIG. 5C may be formed. Details regarding formation thereof are the same as formation of the cap layer 114 and the atomic cap layer 115, and thus, are omitted herefrom.

FIGS. 7A through 7D show semiconductor devices of a third embodiment of the invention.

Figure 7A:
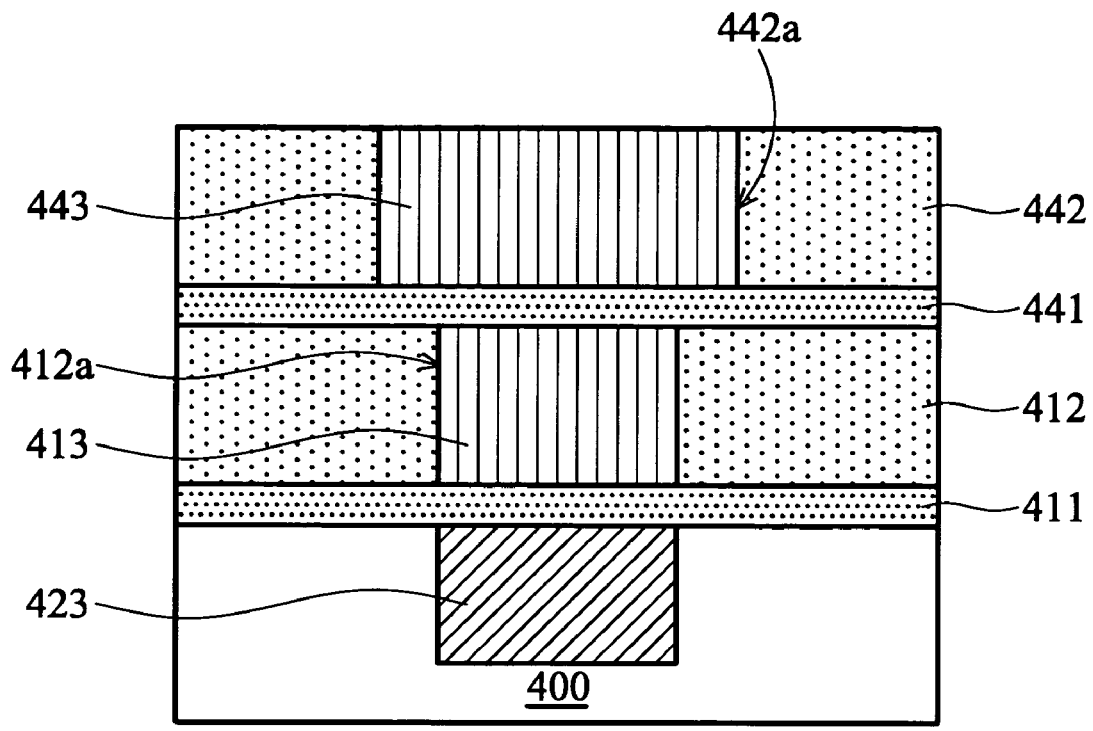
FIGS. 7A through 7D are cross-sections of semiconductor devices of a fourth embodiment of the invention.

In FIG. 7A, the semiconductor device comprises a substrate 400, a first CNT catalyst layer 411, a first dielectric layer 412, plug CNTs 413, a second CNT catalyst layer 441, a second dielectric layer 442, and wiring CNTs 443. The substrate 400 comprises an electrode 423. In some cases, the substrate 400 may further comprise a dielectric layer (not shown) underlying the first CNT catalyst layer 411 and beyond the electrode 423. The first CNT catalyst layer 411 overlies the electrode 423. The first dielectric layer 412 overlies the substrate 400 and comprises a first opening 412a exposing the first CNT catalyst layer 411. The plug CNTs 413 are disposed on the exposed first CNT catalyst layer 411, electrically connecting the electrode 423. The second CNT catalyst layer 441 overlies the plug CNTs 413. The second dielectric layer 442 overlies the substrate 400 and comprises a second opening 442a exposing the second CNT catalyst layer 441. The wiring CNTs 443 are disposed on the exposed second CNT catalyst layer 441, electrically connecting the plug CNTs 413.

The electrode 423 may comprise metal, doped silicon, metal silicide, conductive metal nitride, CNTs, transparent electrode, or other known conductive materials. The electrode 423 may be an electrode of an active device or passive device. In some cases, the electrode 423 may be a terminal of an underlying wiring (not shown), or other known conductive components.

The first CNT catalyst layer 411 may comprise Co and $M_1$, wherein $M_1$ is selected from a group consisting of W, P, B, Bi, Ni, and a combination thereof for deposition of CNTs. Alternatively, the first CNT catalyst layer 411 may comprise Fe, Co, Ni, FeWP, FeWBP, FeWBiP, FeBiP, FeBP, FeBi, FeB, CoWP, CoWBP, CoWBiP, CoBiP, CoBP, CoBi, CoB, NiWP, NiWBP, NiWBiP, NiBiP, NiBP, NiBi, NiB, FeSi, CoSi, NiSi, or a combination thereof. The first CNT catalyst layer 411.preferably comprises CoWP, CoWBP, CoWBiP, CoBiP, CoBP, CoBi, CoB, or a combination thereof.

The second CNT catalyst layer 441 may comprise Co and $M_1$, wherein $M_1$ is selected from a group consisting of W, P, B, Bi, Ni, and a combination thereof for deposition of CNTs. Alternatively, the second CNT catalyst layer 441 may comprise Fe, Co, Ni, FeWP, FeWBP, FeWBiP, FeBiP, FeBP, FeBi, FeB, CoWP, CoWBP, CoWBiP, CoBiP, CoBP, CoBi, CoB, NiWP, NiWBP, NiWBiP, NiBiP, NiBP, NiBi, NiB, FeSi,. CoSi, NiSi, or a combination thereof. The second CNT catalyst layer 441 preferably comprises CoWP, CoWBP, CoWBiP, CoBiP, CoBP, CoBi, CoB, or a combination thereof.

Details regarding the substrate 400, dielectric layers 412 and 442 are the same as the substrate 200 and the dielectric layer 212, and thus, are omitted herefrom.

Figure 7B:
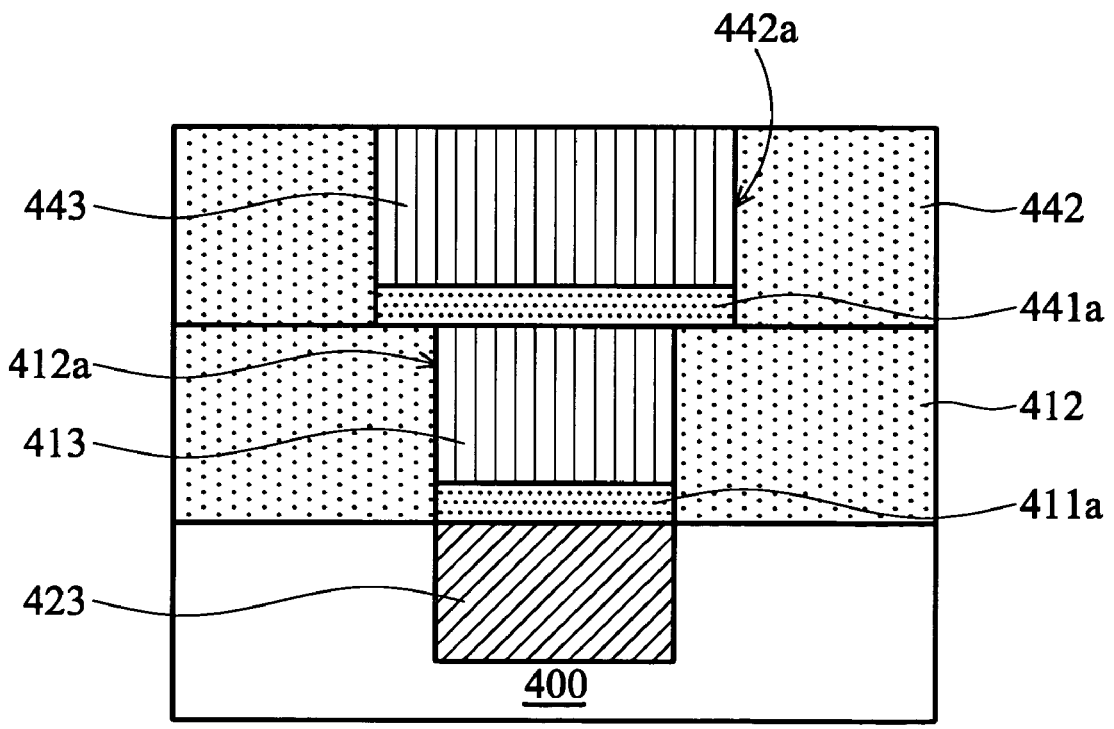

Further, the first CNT catalyst layer 411 and/or the second CNT catalyst layer 441 may be patterned or selectively formed to comprise patterns for the plug CNTs 413 and/or the wiring CNTs 443 as the first CNT catalyst layer 411a and the second CNT catalyst layer 441b as shown in FIG. 7B. Thus, as described, the plug CNTs 413 and/or the wiring CNTs 443 may be formed prior to formation of the first dielectric layer 412 and/or the second dielectric layer 442 to prevent contaminating or damage of these dielectric layers, improving device performance.

Figure 7C:
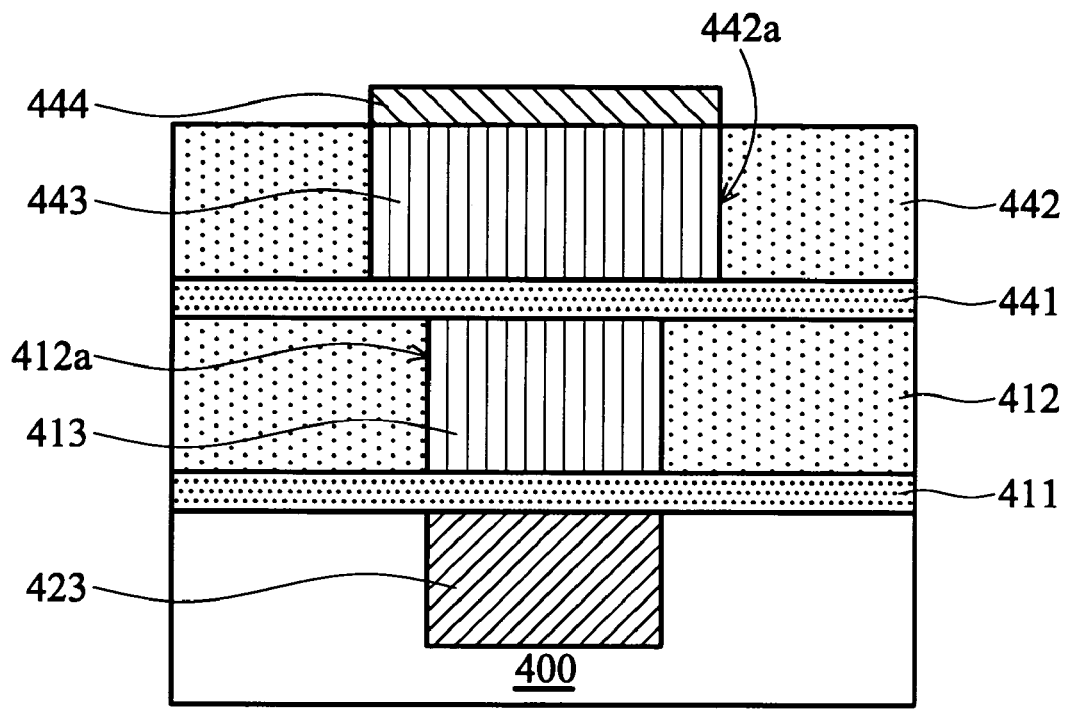

In FIG. 7C, a cap layer 444 is optionally formed overlying the CNTs 443. Alternatively, in FIG. 7D, an atomic cap layer 445 is optionally formed overlying the CNTs 443 and the second. dielectric layer 442. Further, the cap layer 444 and atomic cap layer 444 can also be formed on the semiconductor device shown in FIG. 7B. Details regarding the cap layer 444 and the atomic cap layer 445 are the same as the cap layer 114 and the atomic cap layer 115 shown in FIGS. 1C and 1D, and thus, are omitted herefrom.

FIGS. 8A through 8G show methods for forming semiconductor devices of the invention.

Figure 8A:
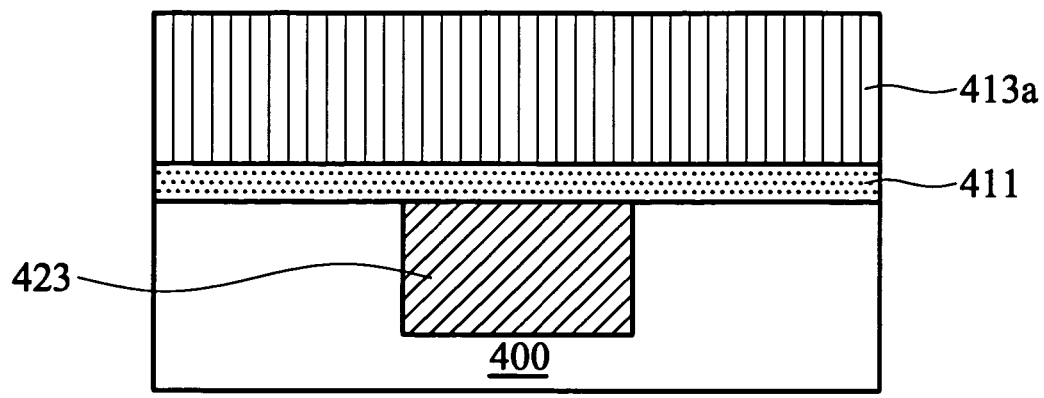
FIGS. 8A through 8G are cross-sections of fabrication methods of semiconductor devices of the invention.

In FIG. 8A, the substrate 400 comprising the electrode 423 is provided. The first CNT catalyst layer 411 is then formed overlying the substrate 400 by a method such as PVD or other methods. Preferably, the first CNT catalyst layer 411 is formed by sputtering. Next, CNTs 413a are formed on the first CNT catalyst layer 411 by a method such as CVD. The CNTs 413a electrically connect the electrode 423. Details regarding formation of the CNTs 413a are the same as formation of the CNTs 113, and thus, are omitted herefrom.

Figure 8B:
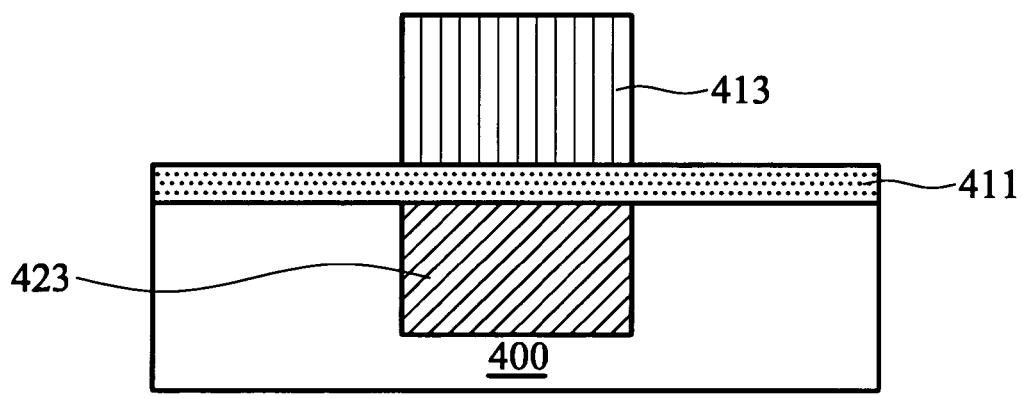

In FIG. 8B, the CNTs 413a are patterned to form patterned CNTs 413 overlying and electrically connecting the electrode 423. Specifically, a patterned resist layer (not shown) comprising a predetermined pattern of the patterned CNTs 413 is formed on the CNTs 413a, followed by etching of the CNTs 413a utilizing the patterned resist layer as an etch mask to form the patterned CNTs 413. The CNTs 413a are preferably etched by oxygen-containing plasma, and more preferably by oxygen plasma. The patterned resist layer is then removed. When the patterned CNTs 413 are utilized as a bump or a terminal for connecting an external device, for example, the process concludes at this step.

Figure 8C:
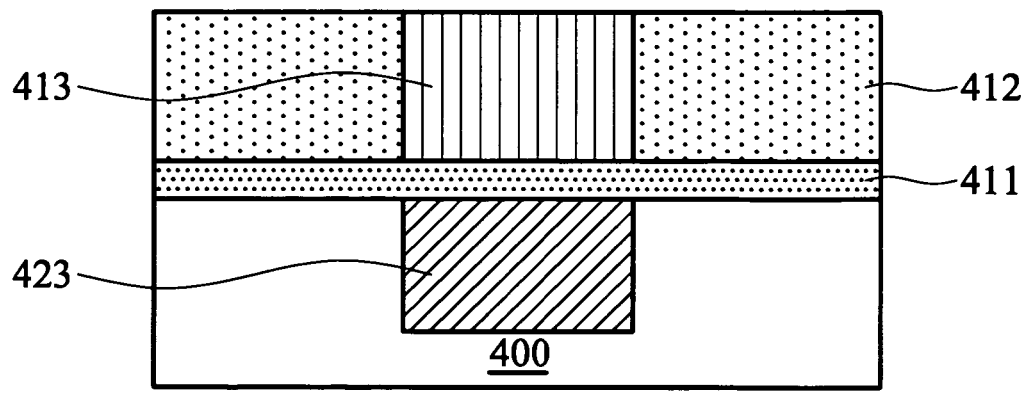

In other cases, the semiconductor device requires a dielectric layer 412 overlying the substrate 400 and beyond the CNTs 413 as shown in FIG. 8C when the CNTs 413 are utilized as a plug, for example. The dielectric layer 412 is preferably formed by a method such as CVD, spin-coating, or other. In some cases, the dielectric layer 412 may comprise low-k dielectric.

Further, the second CNT catalyst layer 441, the wiring CNTs 443, and the second dielectric layer 442 shown in FIG. 7A may be formed by repeating the steps shown in FIGS. 8A through 8C.

Figure 7D:
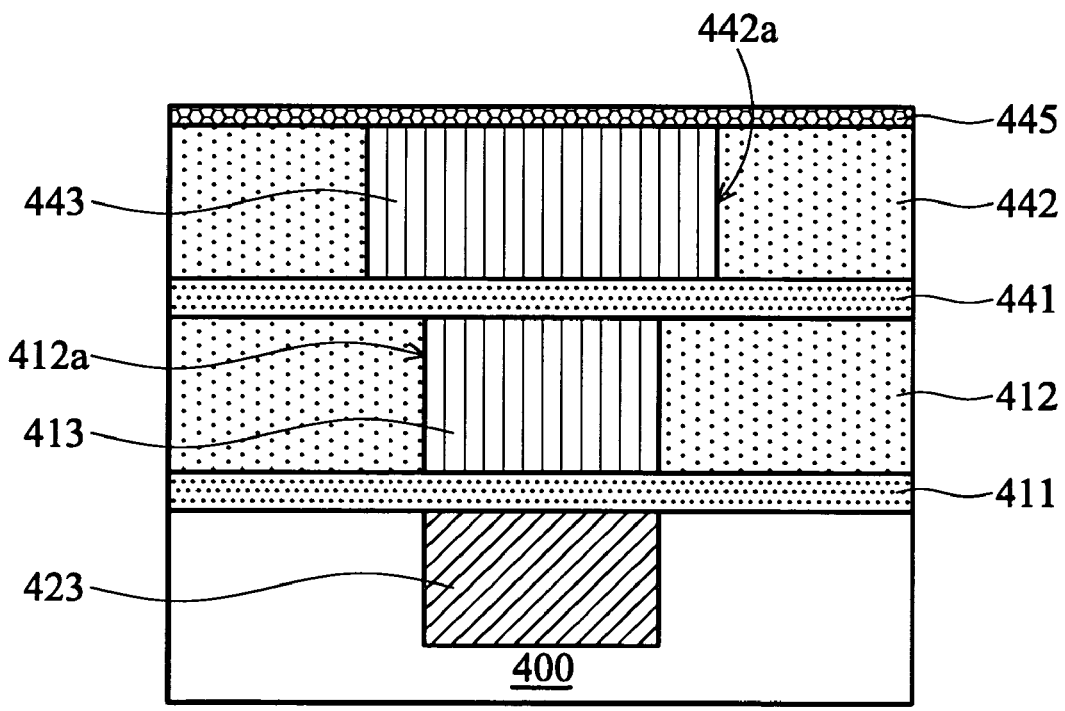

Moreover, either the cap layer 444 or the atomic cap layer 445 shown in FIGS. 7C and 7D may be formed overlying the wiring CNTs 443.

Figure 8D:
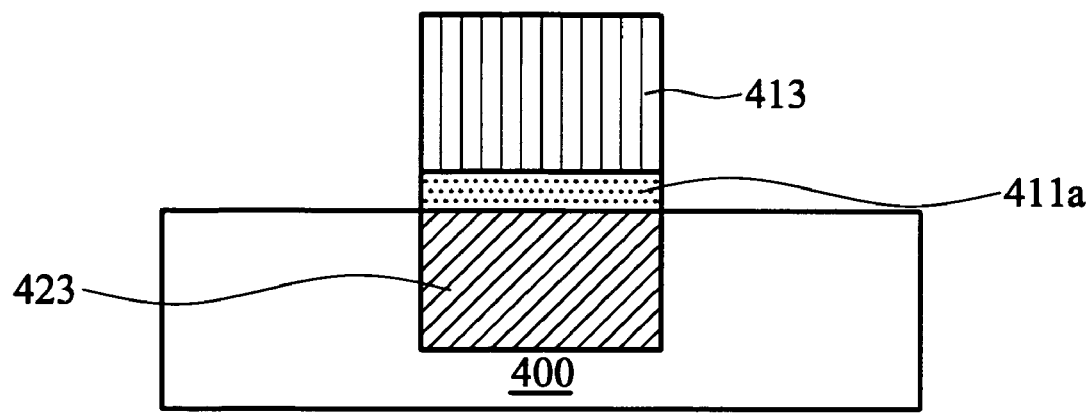

As shown in FIG. 8D, following that shown in FIG. 8B, the first CNT catalyst layer 411 may be patterned utilizing the CNTs 413 as a mask, or simultaneously patterned with the CNTs 413a shown in FIG. 8A. When the patterned CNTs 413 are utilized as a bump or a terminal for connecting an external device, for example, the process concludes at this step.

Figure 8E:
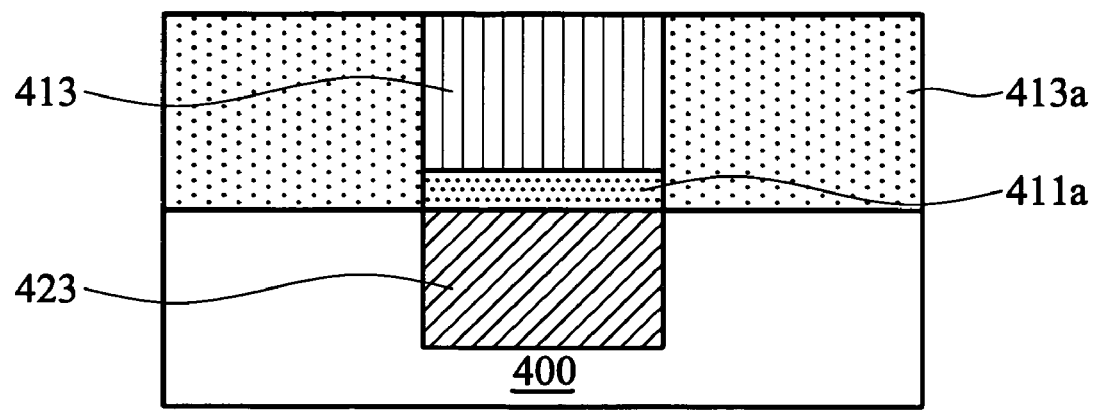

In other cases, the semiconductor device requires a dielectric layer 412 overlying the substrate 400 and beyond the CNTs 413 as shown in FIG. 8E when the CNTs 413 are utilized as a plug, for example. The dielectric layer 412 is preferably formed by a method such as CVD, spin-coating, or other. In some cases, the dielectric layer 412 may comprise low-k dielectric.

Further, the second CNT catalyst layer 441a, the wiring CNTs 443, and the second dielectric layer 442 shown in FIG. 7B may be formed by repeating the steps shown in FIGS. 8A, 8D, and 8E.

Moreover, either the cap layer 444 or the atomic cap layer 445 shown in FIGS. 7C and 7D may be formed overlying the semiconductor device shown in FIG. 7B.

Figure 8F:
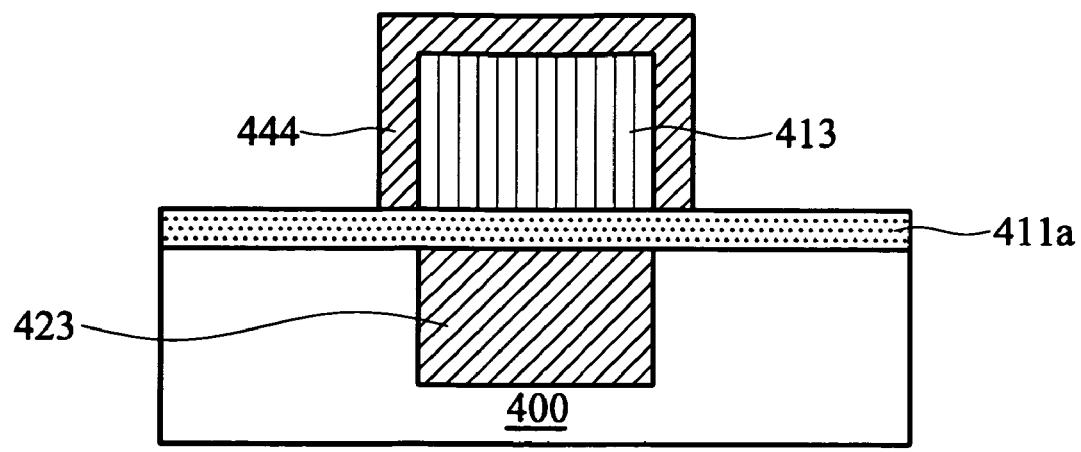
Figure 8G:
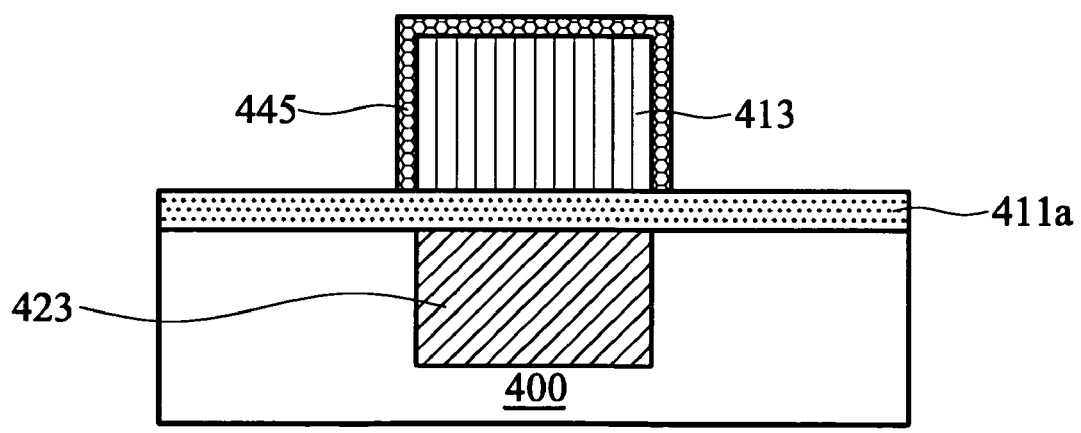

In some cases as shown in FIGS. 8F and 8G, either the cap layer 444 or the atomic cap layer 445 may be formed covering the CNTs 413 shown in FIG. 8B. Similarly, either the cap layer 444 or the atomic cap layer 445 may be formed covering the CNTs 413 of the semiconductor device shown in FIG. 8D.

Details regarding formation of the cap layer 444 and the atomic cap layer 445 are the same as those of the cap layer 114 and the atomic cap layer 115, and thus, are omitted herefrom.

Figure 9A:
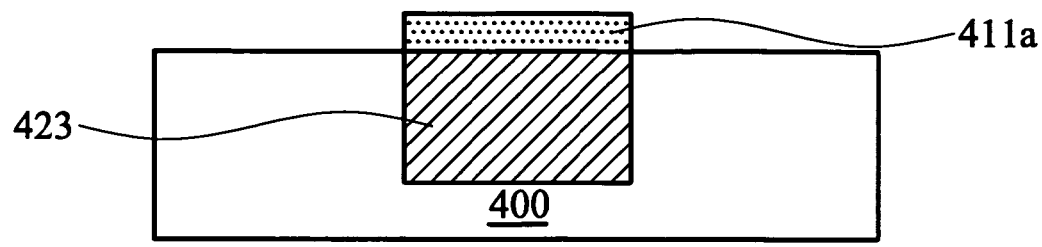
FIGS. 9A through 9C are cross-sections of fabrication methods of semiconductor devices of the invention.
Figure 9B:
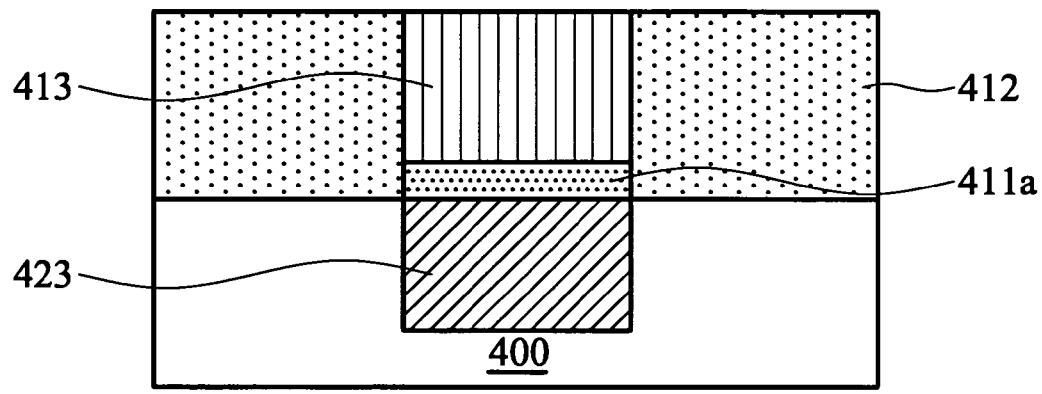
Figure 9C:
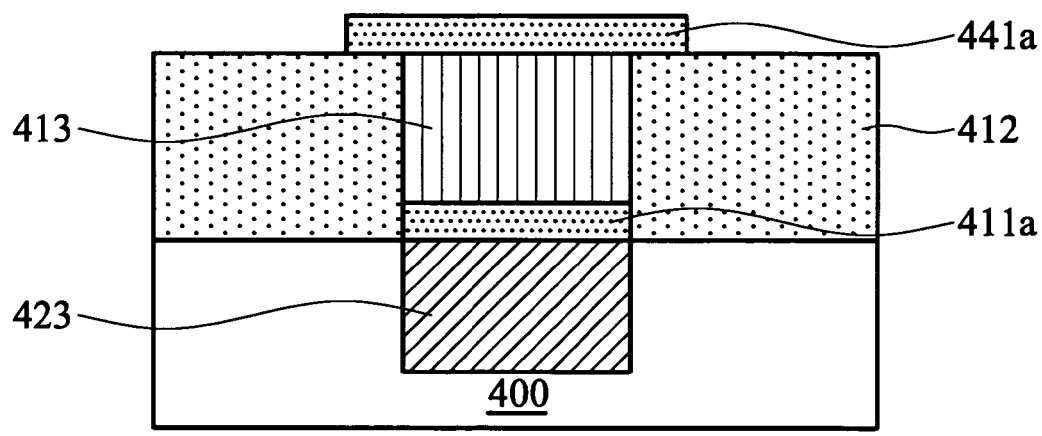

FIGS. 9A through 9C show methods for forming semiconductor devices of the invention.

In FIG. 9A, a substrate 400 comprising electrode 423 is provided. The first CNT catalyst layer 411a is then selectively formed overlying the electrode 413 by a method such as electroless plating or other. Details regarding selective formation of the first CNT catalyst layer 411a are the same as that of the selective catalyst layer 311, and thus, are omitted herefrom.

The CNTs 413 are then formed on the first CNT catalyst layer 411a by a method such as CVD to complete the semiconductor device shown in FIG. 8D. In this embodiment, the first CNT catalyst layer 411a is selectively formed, and the CNTs 413 are formed according to the pattern of the first CNT catalyst layer 411a. Thus, the etch step forming the CNTs 413 described for FIGS. 8B and 8D can be omitted, reducing production costs and time.

When the patterned CNTs 413 are utilized as a bump or a terminal for connecting an external device, for example, the process may stop at this step.

In other cases, the semiconductor device requires a dielectric layer 412 overlying the substrate 400 and beyond the CNTs 413 as shown in FIG. 8E when the CNTs 413 are utilized as a plug, for example. The dielectric layer 412 is preferably formed by a method such as CVD, spin-coating, or other. In some cases, the dielectric layer 412 may comprise low-k dielectric.

Subsequently, the steps shown in FIGS. 8A through 8C may be performed to form the second CNT catalyst layer 441, the wiring CNTs 443, and the second dielectric layer 442 shown in FIG. 7A. Optionally, either the cap layer 444 or the atomic cap layer 445 shown in FIGS. 7C and 7D may be formed overlying the wiring CNTs 443 and the second dielectric layer 442.

Alternatively, the steps shown in FIGS. 8A, 8D, and 8E may be performed to form the second CNT catalyst layer 441a, the wiring CNTs 443, and the second dielectric layer 442 shown in FIG. 7B. Optionally, either the cap layer 444 or the atomic cap layer 445 shown in FIGS. 7C and 7D may be formed overlying the wiring CNTs 443 and the second dielectric layer 442.

Alternatively, a CNT catalyst layer can be formed overlying the plug CNTs 413 and the first dielectric layer 412 by a method such as PVD or other, followed by patterning to form the second CNT catalyst layer 441a comprising a predetermined wiring pattern. The wiring CNTs 443 and the second dielectric layer 442 shown in FIG. 7B are then formed by repeating the step shown in FIG. 9B. Optionally, either the cap layer 444 or the atomic cap layer 445 shown in FIGS. 7C and 7D may be formed overlying the wiring CNTs 443 and the second dielectric layer 442.

The efficacy of the inventive wiring layer, and semiconductor devices utilizing the same at preventing high resistance, open circuitry, and damage or poisoning of dielectric layers, provides improved device reliability, yield, and performance.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. A wiring layer, comprising:
   a catalyst layer, substantially comprising Co and $M_1$, wherein $M_1$ is selected from a group consisting of W, P, B, Bi, Ni, and a combination thereof, overlying a substrate;
   a dielectric layer overlying the catalyst layer, comprising an opening exposing at least parts of the catalyst layer; and
   carbon nanotubes (CNTs) disposed on the exposed catalyst layer.

2. The layer as claimed in claim 1, further comprising a cap layer overlying the CNTs.

3. The layer as claimed in claim 2, wherein the cap layer comprises Fe, Co, Ni, FeWP, FeWBP, FeWBiP, FeBiP, FeBP, FeBi, FeB, CoWP, CoWBP, CoWBiP, CoBiP, CoBP, CoBi, CoB, NiWP, NiWBP, NiWBiP, NiBiP, NiBP, NiBi, NiB, FeSi, CoSi, NiSi, or a combination thereof.

4. The layer as claimed in claim 2, wherein the cap layer is between 25 and 200 Å thick.

5. The layer as claimed in claim 1, further comprising an atomic cap layer overlying the CNTs and dielectric layer.

6. The layer as claimed in claim 5, wherein the atomic cap layer comprises Ta/TaN or Ti/TiN.

7. The layer as claimed in claim 5, wherein the atomic cap layer is between 2 and 10 Å thick.

8. The layer as claimed in claim 1, wherein the catalyst layer substantially comprises CoWP, CoWBP, CoWBiP, CoBiP, CoBP, CoBi, CoB, or a combination thereof.

9. The layer as claimed in claim 1, wherein the CNTs fill the opening.

10. The device as claimed in claim 1, wherein all of the CNTs are disposed on the exposed catalyst layer.

11. The device as claimed in claim 1, wherein the CNTs are in contact with the exposed catalyst layer.

12. A semiconductor device, comprising:
    a substrate comprising an overlying first dielectric layer with an electrode embedded therein;
    a catalyst layer, substantially comprising Co and $M_1$, wherein $M_1$ is selected from a group consisting of W, P, B, Bi, Ni, and a combination thereof, overlying the electrode and the first dielectric layer;
    a second dielectric layer overlying the catalyst layer and comprising an opening exposing parts of the catalyst layer; and
    carbon nanotubes (CNTs) disposed on the exposed catalyst layer, electrically connecting the electrode.

13. The device as claimed in claim 12, further comprising a cap layer overlying the CNTs.

14. The device as claimed in claim 13, wherein the cap layer comprises Fe, Co, Ni, FeWP, FeWBP, FeWBiP, FeBiP, FeBP, FeBi, FeB, CoWP, CoWBP, CoWBiP, CoBiP, CoBP, CoBi, CoB, NiWP, NiWBP, NiWBiP, NiBiP, NiBP, NiBi, NiB, FeSi, CoSi, NiSi, or a combination thereof.

15. The device as claimed in claim 13, wherein the cap layer is between 25 and 200 Å thick.

16. The device as claimed in claim 13, further comprising an atomic cap layer overlying the CNTs and second dielectric layer.

17. The device as claimed in claim 16, wherein the atomic cap layer comprises Ta/TaN or Ti/TiN.

18. The device as claimed in claim 16, wherein the atomic cap layer is between 2 and 10 Å thick.

19. The device as claimed in claim 16, wherein the catalyst layer substantially comprises CoWP, CoWBP, CoWBiP, CoBiP, CoBP, CoBi, CoB, or a combination thereof.

20. The device as claimed in claim 12, wherein the electrode comprises metal, doped silicon, metal silicide, conductive metal nitride, or transparent electrode.

21. The device as claimed in claim 12, wherein all of the CNTs are disposed on the exposed catalyst layer.

22. The device as claimed in claim 12, wherein the CNTs are in contact with the exposed catalyst layer.

23. A semiconductor device, comprising:
    a substrate comprising an overlying first dielectric layer with an electrode embedded therein;
    a selective catalyst layer, substantially comprising Co and $M_1$, wherein $M_1$ is selected from a group consisting of W, P, B, Bi, Ni, and a combination thereof, overlying the electrode;
    carbon nanotubes (CNTs) disposed on the catalyst layer, electrically connecting the electrode; and
    a second dielectric layer overlying the substrate and beyond the CNTs.

24. The device as claimed in claim 23, further comprising a cap layer overlying the CNTs.

25. The device as claimed in claim 24, wherein the cap layer comprises Fe, Co, Ni, FeWP, FeWBP, FeWBiP, FeBiP, FeBP, FeBi, FeB, CoWP, CoWBP, CoWBiP, CoBiP, CoBP, CoBi, CoB, NiWP, NiWBP, NiWBiP, NiBiP, NiBP, NiBi, NiB, FeSi, CoSi, NiSi, or a combination thereof.

26. The device as claimed in claim 24, wherein the cap layer is between 25 and 200 Å thick.

27. The device as claimed in claim 23, further comprising an atomic cap layer overlying the CNTs and second dielectric layer.

28. The device as claimed in claim 27, wherein the atomic cap layer comprises Ta/TaN or Ti/TiN.

29. The device as claimed in claim 27, wherein the atomic cap layer is between 2 and 10 Å thick.

30. The device as claimed in claim 23, wherein the catalyst layer substantially comprises CoWP, CoWBP, CoWBiP, CoBiP, CoBP, CoBi, CoB, or a combination thereof.

31. The device as claimed in claim 23, wherein all of the CNTs are disposed on the exposed catalyst layer.

32. The device as claimed in claim 23, wherein the CNTs are in contact with the exposed catalyst layer.

* * * * *